US011913989B2

(12) United States Patent
Rascon et al.

(10) Patent No.: US 11,913,989 B2
(45) Date of Patent: Feb. 27, 2024

(54) BURN-IN BOARD INCLUDING STRIP SOCKET WITH INTEGRATED HEATING FOR HIGH VOLUME BURN-IN OF SEMICONDUCTOR DEVICES

(71) Applicant: Microchip Technology Incorporated, Chandler, AZ (US)

(72) Inventors: Joseph Rascon, Gilbert, AZ (US); Aaron Moreno, Chandler, AZ (US); Alberto Aguilera, Maricopa, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 479 days.

(21) Appl. No.: 17/174,392

(22) Filed: Feb. 12, 2021

(65) Prior Publication Data

US 2021/0255237 A1 Aug. 19, 2021

Related U.S. Application Data

(60) Provisional application No. 62/977,779, filed on Feb. 18, 2020.

(51) Int. Cl.
*G01R 31/28* (2006.01)
*H01R 33/88* (2006.01)
(Continued)

(52) U.S. Cl.
CPC ..... *G01R 31/2863* (2013.01); *G01R 31/2875* (2013.01); *H01R 12/88* (2013.01);
(Continued)

(58) Field of Classification Search
CPC ............ G01R 31/2856; G01R 31/2875; G01R 31/2877
See application file for complete search history.

(56) References Cited

U.S. PATENT DOCUMENTS 10,466,273 B1 11/2019 Hwang et al.
2005/0125712 A1* 6/2005 Co ..................... G01R 31/2855
365/201

(Continued)

FOREIGN PATENT DOCUMENTS

JP 2007064925 A 3/2007 ............. G01R 31/26
JP 2007078388 A 3/2007 ............. G01R 31/26

OTHER PUBLICATIONS

International Search Report and Written Opinion, Application No. PCT/US2021/018159, 18 pages, dated May 17, 2021.

*Primary Examiner* — Tung X Nguyen
(74) *Attorney, Agent, or Firm* — SLAYDEN GRUBERT BEARD PLLC

(57) ABSTRACT

A burn-in board for burn-in testing of semiconductor devices includes a strip socket mounted to a PCB. The strip socket includes a socket base configured to receive a device strip including an array of semiconductor devices, and a socket lid including at least one heating block. The socket lid is movable moved between (a) an open position allowing the device strip to be mounted on the socket base and (b) a closed position in which the socket lid including the heating block(s) is closed down on the mounted device strip. The strip socket includes conductive contacts configured to contact individual semiconductor devices on the device strip to allow selective monitoring of individual semiconductor devices during a burn-in test process. The burn-in board may also include heating control circuitry to control the heating block(s) during the burn-in test process.

21 Claims, 22 Drawing Sheets

(51) Int. Cl.
*H01R 33/97* (2006.01)
*H01R 12/88* (2011.01)
*H01R 33/74* (2006.01)

(52) U.S. Cl.
CPC ............. *H01R 33/88* (2013.01); *H01R 33/97* (2013.01); *H01R 33/74* (2013.01); *H01R 2201/20* (2013.01)

(56) References Cited

U.S. PATENT DOCUMENTS

| | | | | |
|---|---|---|---|---|
| 2006/0186909 | A1* | 8/2006 | Aube | G01R 31/2875 324/750.09 |
| 2009/0174427 | A1* | 7/2009 | Weinraub | G01R 31/2863 324/763.01 |
| 2017/0279211 | A1 | 9/2017 | Tadepalli | |

* cited by examiner

BURN-IN BOARD INCLUDING STRIP SOCKET WITH INTEGRATED HEATING FOR HIGH VOLUME BURN-IN OF SEMICONDUCTOR DEVICES

RELATED APPLICATION

This application claims priority to commonly owned U.S. Provisional Patent Application No. 62/977,779 filed Feb. 18, 2020, the entire contents of which are hereby incorporated by reference for all purposes.

TECHNICAL FIELD

The present disclosure relates to semiconductor devices burn-in, and more particularly, to a burn-in board including a strip socket with integrated heating for high-volume burn-in of semiconductor devices.

BACKGROUND

In the field of semiconductor manufacturing and testing, "burn-in" is a common process for detecting failures in a population of semiconductor devices. A burn-in process typically involves electrical testing of a device at elevated or extreme voltages and temperatures. Burn-in is typically performed on devices or device components as they are produced, to detect early failures caused by faults in the manufacturing process.

In a typical burn-in system, individual semiconductor devices are loaded into "sockets" mounted on a burn-in board and then subjected to specified burn-in test conditions. FIG. 1 shows an example conventional burn-in board 100 including an array of discrete sockets 102 mounted on a printed circuit board (PCB) 104. An individual (singulated) semiconductor device, referred to as a device under test or "DUT," may be manually loaded into each socket 102 on the board 100, and the board 100 may be inserted in a thermal chamber (oven) of a burn-in test machine in which the semiconductor devices are subjected to elevated or extreme voltages and temperatures and subjected to various electrical testing over time to identify defective devices. FIG. 2 shows an example burn-in test machine 200 including two thermal chambers 202, each including multiple slots 204 configured to receive a respective burn-in board, e.g., burn-in board 100 shown in FIG. 1.

Conventional burn-in systems and techniques for testing individual devices are costly and time consuming, e.g., requiring the manual loading of hundreds or thousands of individual devices into discrete sockets, and typically require significant resources for high-volume device burn-in (i.e., testing of a large number of devices).

There is a need for a high-volume device burn-in solution that reduces the required resources (time and/or cost) for burn-in testing.

SUMMARY

Embodiments herein provide a burn-in board for burn-in testing of semiconductor devices which includes a strip socket mounted to a printed circuit board (PCB). The strip socket includes a socket base configured to receive a device strip including an array of semiconductor devices, a socket lid movably connected to the socket base and including at least one heating block. The socket lid is movable moved between (a) an open position allowing the device strip to be mounted on the socket base and (b) a closed position in which the socket lid including the heating block(s) is closed down on the mounted device strip. The strip socket includes conductive contacts configured to contact individual semiconductor devices on the device strip to allow selective monitoring of individual semiconductor devices during a burn-in test process. The burn-in board may also include heating control circuitry to control the heating block(s) during the burn-in test process.

In one aspect, a burn-in board for burn-in testing of devices includes a PCB and a strip socket mounted to the PCB. The strip socket may include a socket base configured to receive a device strip including an array of devices mounted on a device strip substrate; a socket lid; and at least one heating block associated with the socket lid, wherein the socket lid is movable between (a) an open position allowing the device strip to be mounted on the socket base and (b) a closed position in which the mounted device strip is arranged between the socket lid and socket base. The socket base may also include an array of conductive contacts, each configured to contact a respective device in the array of devices on the mounted device strip. The burn-in board may include heating control circuitry configured to control the at least one heating block to provide heating to the device strip, and burn-in test circuitry connected to the conductive contacts for supplying input test signals to individual devices on the device strip, and receiving output test signals from the individual devices.

In one embodiment, the at least one heating block is integrated in, or mounted to, the socket lid.

In one embodiment, in the closed position of the socket lid, the mounted device strip is physically compressed between the socket lid and the socket base to bring the conductive contacts into contact with the individual devices on the device strip. In one embodiment, the socket base includes a contactor plate configured to support the device strip, and the conductive contacts are configured to project through holes in the contactor plate.

In one embodiment, the strip socket is configured to receive a device strip including multiple device panels, each including multiple devices, the strip socket includes multiple sections, each corresponding with a respective device panel on the device strip, and the strip socket includes multiple heating blocks, each arranged for heating a respective device panel on the device strip. In one embodiment, the multiple heating blocks are independently controllable to provide independent temperature control of the multiple device panels on the device strip.

In one embodiment, the burn-in board includes a multiplexer connected to a plurality of conductive contacts in the array of conductive contacts, the plurality of conductive contacts configured to contact a corresponding plurality of devices in the array of devices; and a multiplexer control circuitry configured to control the multiplexer to selectively receive signals from each device in the plurality of devices via a respective conductive contact of the plurality of conductive contacts.

In one embodiment, the burn-in board includes (a) a performance signal multiplexer connected to a first subset of conductive contacts in the array of conductive contacts, (b) a power signal multiplexer connected to a second subset of conductive contacts in the array of conductive contacts, and (c) multi-signal-type multiplexer control circuitry configured to control the performance signal multiplexer and the power signal multiplexer to selectively monitor device performance signals and power signals from individual devices in the array of devices.

Another aspect provides a strip socket for burn-in testing of an array of devices provided on a device strip. The strip socket may include a socket base configured to receive a device strip including an array of devices mounted on a device strip substrate; a socket lid; and an array of conductive contacts, each configured to contact a respective device in the array of devices. The socket lid may be movable between (a) an open position allowing the device strip to be mounted on the socket base and (b) a closed position in which the mounted device strip is arranged between the socket lid and socket base.

In one embodiment, the at least one heating block is integrated in or mounted to the socket lid.

In one embodiment, in the closed position of the socket lid, the mounted device strip is physically compressed between the socket lid and the socket base to bring the conductive contacts into contact with the individual devices on the device strip. In one embodiment, the socket base includes a contactor plate configured to support the device strip, and the conductive contacts are configured to project through holes in the contactor plate.

In one embodiment, the strip socket is configured to receive a device strip including multiple device panels, each including multiple devices, the strip socket includes multiple sections, each corresponding with a respective device panel on the device strip, and the strip socket includes multiple heating blocks, each arranged for heating a respective device panel on the device strip.

In one embodiment, the multiple heating blocks are independently controllable to provide independent temperature control of the multiple device panels on the device strip.

Another aspect provides a system for burn-in testing of devices. The system includes a burn-in test machine, and a burn-in board. The burn-in board includes a printed circuit board (PCB), and strip socket mounted to the PCB, and heating control circuitry. The strip socket includes a socket base configured to receive a device strip including an array of devices mounted on a device strip substrate, a socket lid, at least one heating block associated with the socket lid, wherein the socket lid is movable between (a) an open position allowing the device strip to be mounted on the socket base and (b) a closed position in which the mounted device strip is arranged between the socket lid and socket base, an array of conductive contacts, each configured to contact a respective device in the array of devices, and a connection interface connected to the array of conductive contacts. The heating control circuitry is configured to control the at least one heating block to provide heat to the device strip. The burn-in test machine is configured to supply input test signals to individual devices on the device strip via the connection interface and the conductive contacts of the strip socket, and receive output test signals from the individual devices via the conductive contacts and connection interface of the strip socket.

In one embodiment, the burn-in test machine comprises a test bench. In another embodiment, the burn-in test machine comprises burn-in oven machine.

In one embodiment, the at least one heating block is integrated in, or mounted to, the socket lid.

In one embodiment, in the closed position of the socket lid, the mounted device strip is physically compressed between the socket lid and the socket base to bring the conductive contacts into contact with the individual devices on the device strip.

In one embodiment, the device strip includes multiple device panels, each including multiple devices, the strip socket includes multiple sections, each corresponding with a respective device panel on the device strip, and the at least one heating block comprises multiple heating blocks, each arranged for heating a respective device panel on the device strip.

In one embodiment, the multiple heating blocks are independently controllable to provide independent temperature control of each of the multiple device panels on the device strip.

In one embodiment, the burn-in test electronics include electrical fault detection circuitry configured to detect an electrical fault associated with each individual device, and device performance monitoring circuitry configured to measure an operational performance of each individual device.

BRIEF DESCRIPTION OF THE DRAWINGS

Example aspects of the present disclosure are described below in conjunction with the figures, in which.

Figure 1:
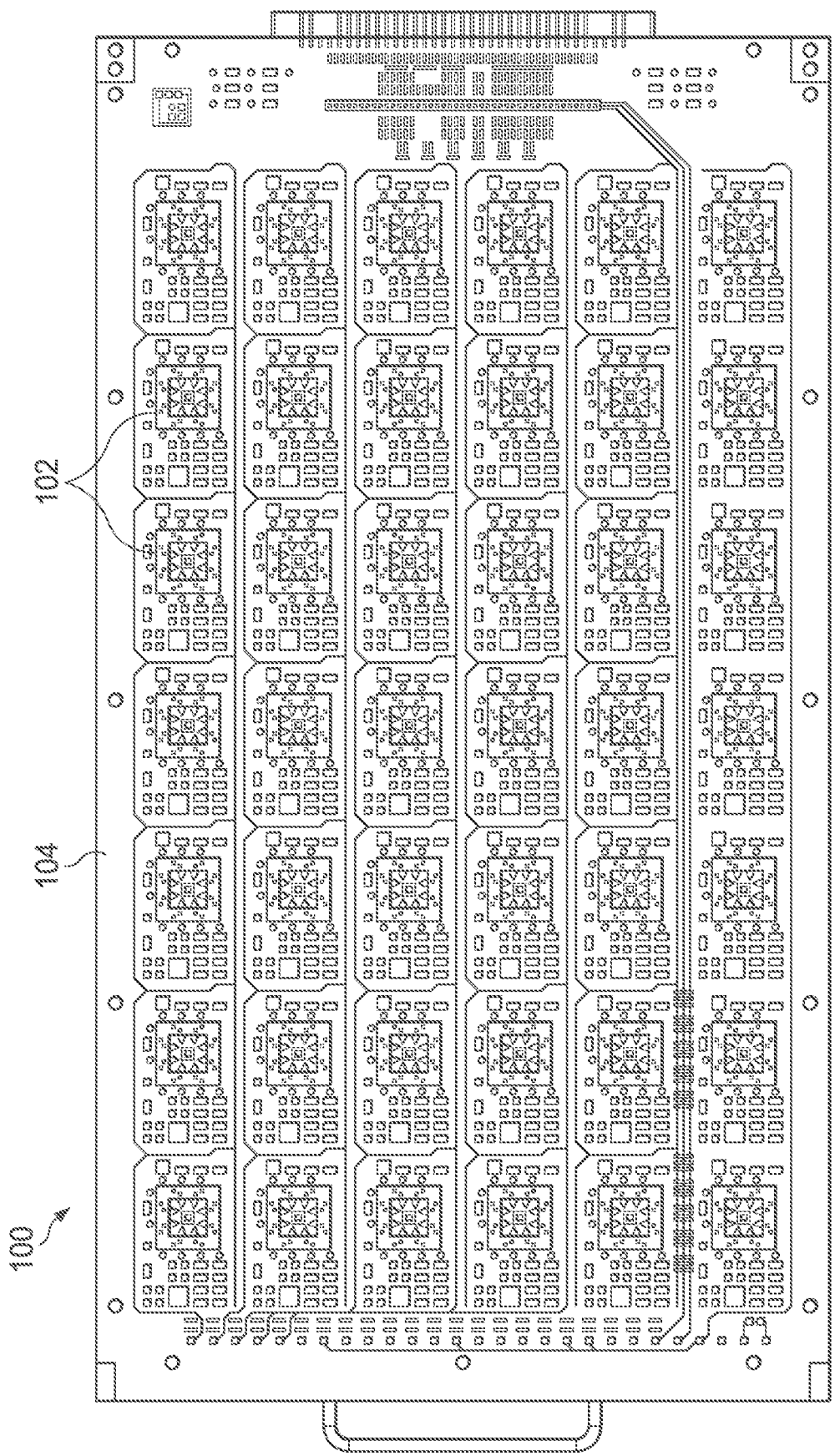
FIG. 1 shows an example prior-art burn-in board including an array of discrete sockets mounted on a PCB.
Figure 2:
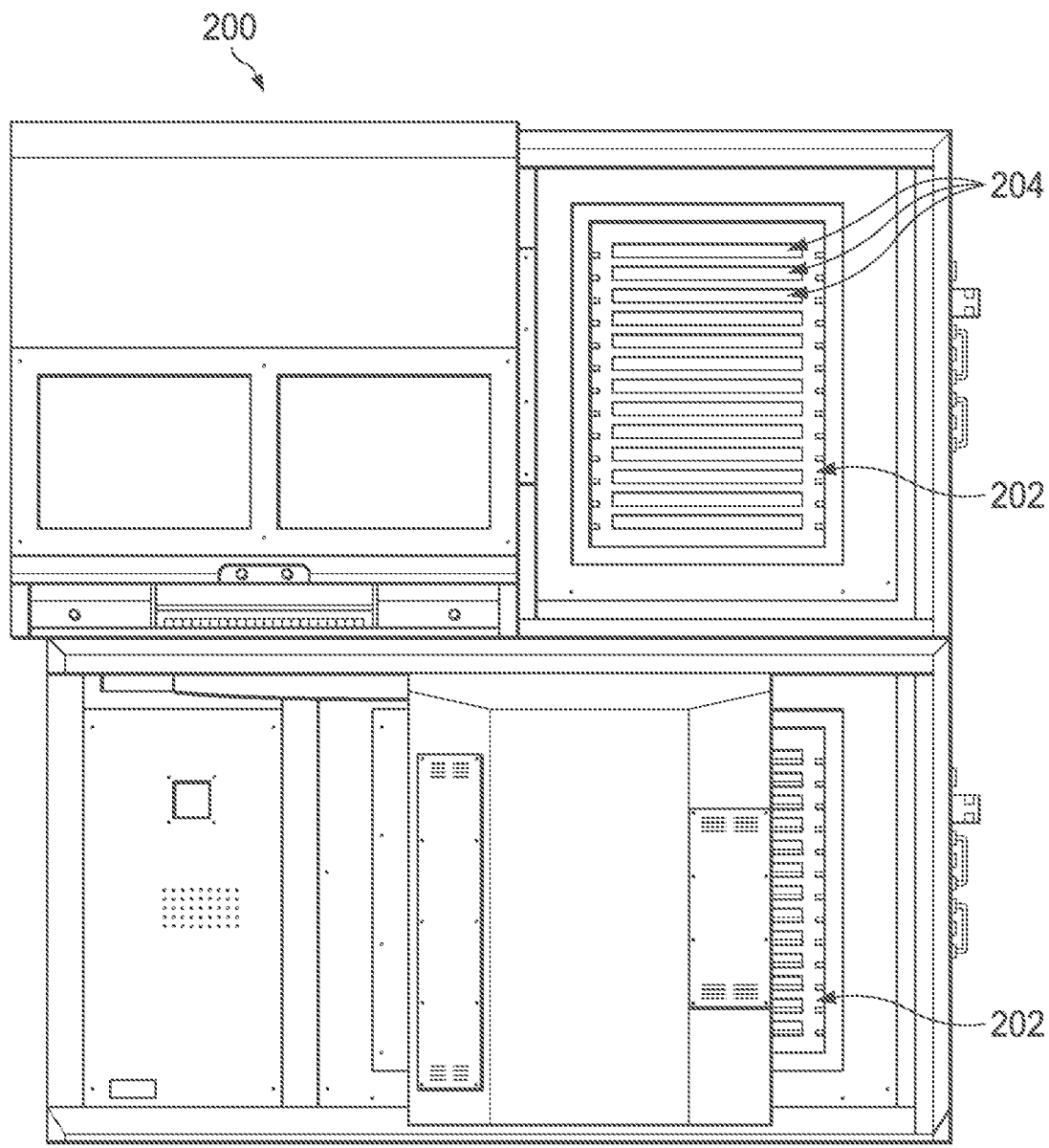
FIG. 2 shows an example prior-art burn-in test machine including thermal chambers configured to receive burn-in boards for high-temperature burn-in testing of devices mounted in sockets on the burn-in boards.

It should be understood that the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

Embodiments herein provide systems and methods for high volume burn-in on a single burn-in board. In some embodiments the burn-in board includes a strip socket, which may be of a clamshell-type, that receives a device strip between a socket base and a socket lid, which socket lid may be liftable, such that the full array of semiconductor devices on the device strip (for example 1,170 semiconductor devices) are loaded simultaneously. This may greatly reduce the testing setup time as compared with conventional systems that require loading of individual (singulated) semiconductor devices into discrete sockets. The strip socket may provide electrical connectivity to each semiconductor device on the device strip (e.g., to individual pins on each device), such that each individual semiconductor device may be tested and analyzed independently, e.g., to identify individual failed or failing devices. For example, the burn-in board may provide for power control and output signal monitoring for each individual semiconductor device on the device strip.

In some embodiments, the strip socket includes integrated, controllable heating block(s) such that the burn-in process may be performed (e.g., on a test bench) without needing to insert the socket into a thermal chamber or oven. This allows for the inclusion of various types of electronics on the burn-in board that typically do not function properly, or effectively, at elevated temperatures experienced in a burn-in oven. Such electronics include, for example, multiplexers and current limiters.

In some embodiments, the heating block(s) may be mounted to, or integrated in, the liftable socket lid, which may be closed and clamped down onto the device strip after the device strip board is inserted into the strip socket (i.e., on the socket base). In one embodiment, the strip socket includes multiple sections (strip socket sections), for example to receive a device strip having an array of devices arranged in multiple panels, i.e., sub-arrays. Each strip socket section may have a respective independently-controllable heating block to provide independent temperature control of the device panel arranged in the respective strip socket section. In some embodiments, the multiple independently-controllable heating blocks may be provided in a common socket lid spanning the multiple strip socket sections, or provided in independent socket lids, each for respective individual strip socket sections.

A strip socket including heating block(s) for heating a device strip mounted in the strip socket, e.g., for performing burn-in testing of devices on the device strip, may be referred to herein as a "heated strip socket."

Embodiments herein provide heated strip sockets configured for testing various types and configurations of device strips, e.g., including any number and type(s) of semiconductor devices arranged on a device strip substrate in any suitable physical arrangement.

Figure 3A:
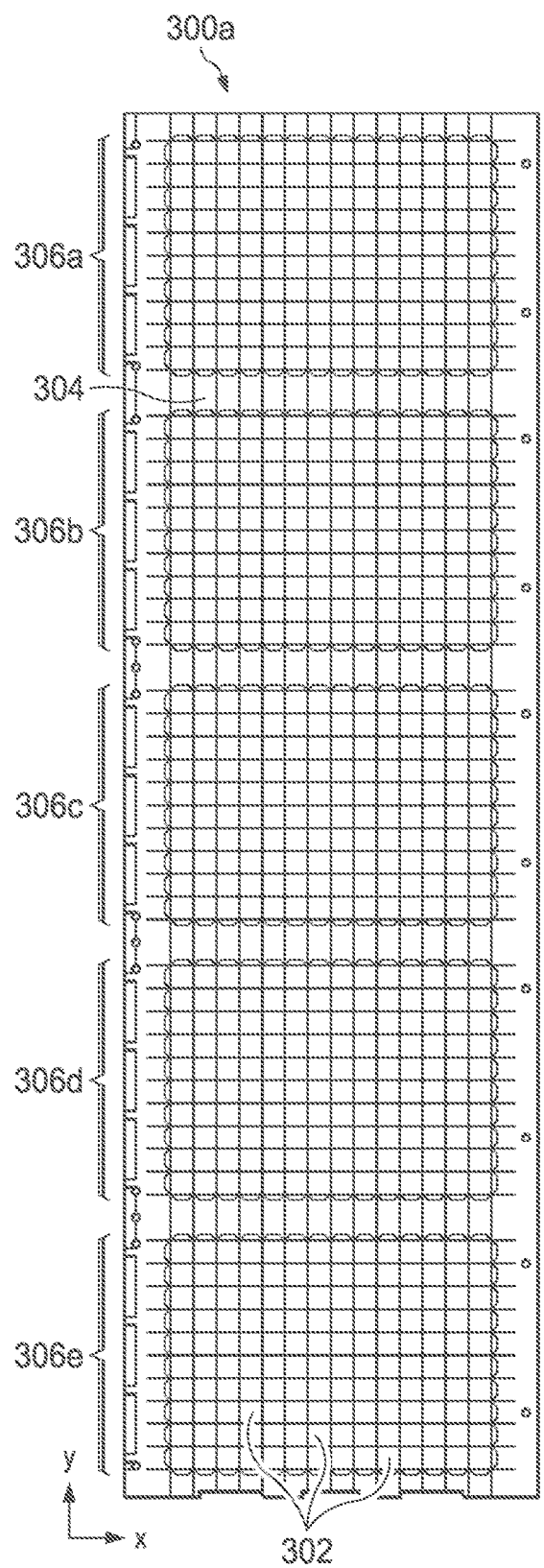
FIGS. 3A-3C show three example device strips that may be tested using strip sockets provided according to the present embodiments.
Figure 3B:
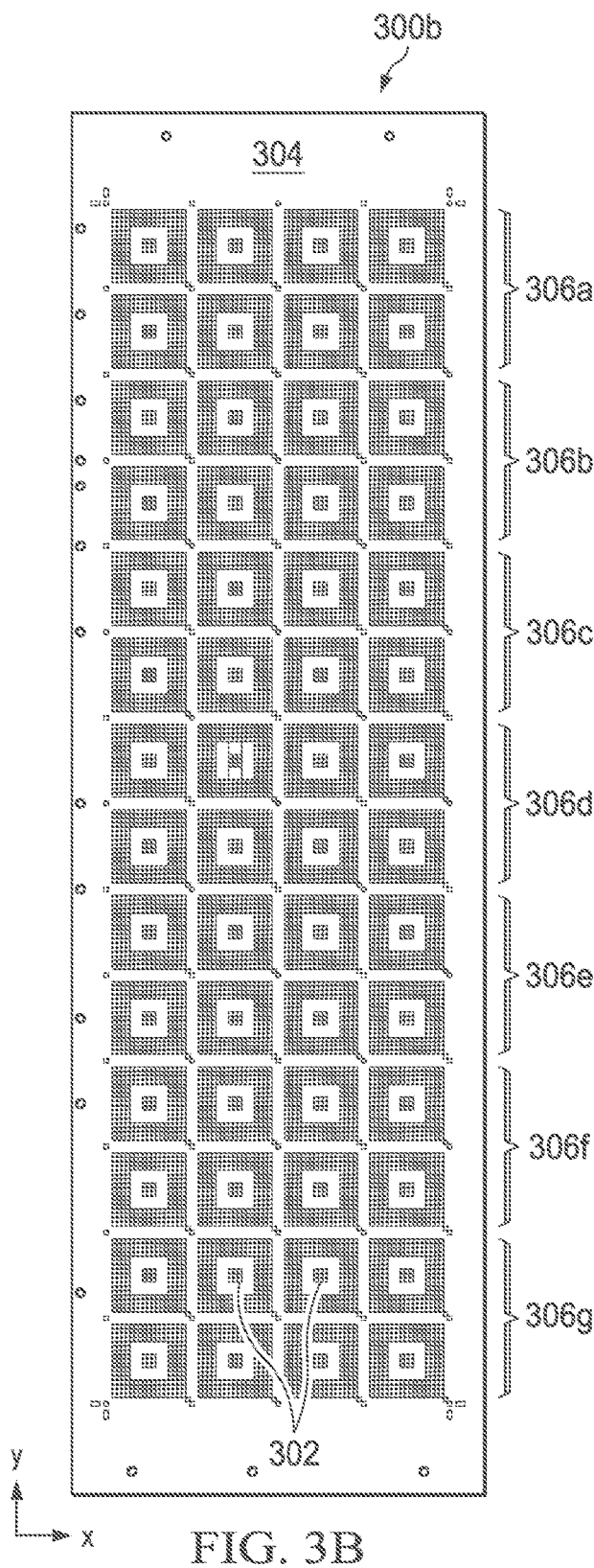
Figure 3C:
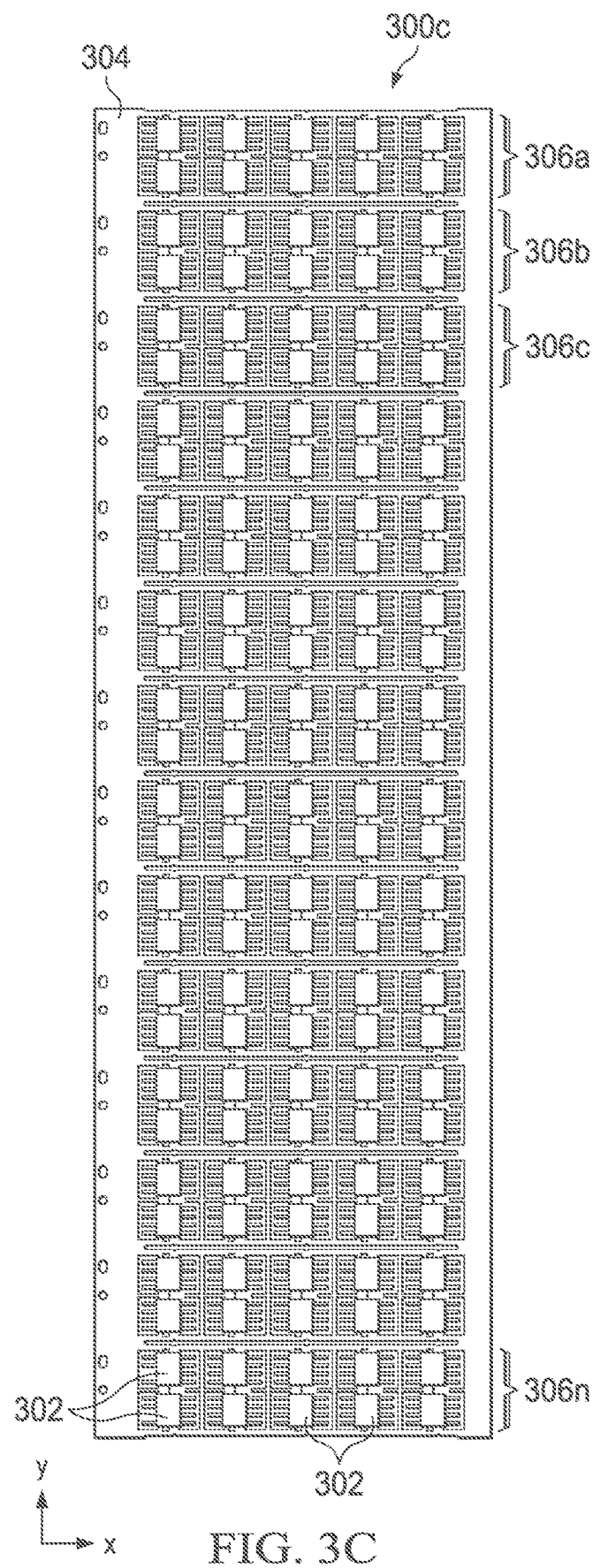

FIGS. 3A-3C shows three example device strips 300a-300c that may be tested using heated strip sockets provided according to various embodiments. As discussed above, each device strip 300a-300c includes an array of semiconductor devices ("devices") 302 arranged on a respective device strip substrate 304, e.g., a printed circuit board (PCB) or leadframe. During a burn-in test procedure, each device 302 may be referred to as "device under test" or "DUT."

For each device strip 300a-300c, the array of devices 302 may be arranged in multiple device groups or "device panels," wherein each device panel includes a subset of the devices 302 arranged in one or more rows and one or more columns, or any other physical arrangement of devices. For example, the example device strip 300a includes 1,170 devices 302 arranged in five device panels 306a-306e, each device panel including 234 devices 302 arranged in 13 rows extending along the x-direction and 18 columns extending along the y-direction, each of the 18 columns defining a "cluster" of 13 devices 302. As another example, the example device strip 300b includes seven device panels 306a-306g, wherein devices panels each including 8 devices 302 arranged in two rows each extending along the x-direction and four columns extending along the y-direction. As yet another example, the example device strip 300c includes 14 device panels 306a-306n, each including 10 devices 302 arranged in two rows extending along the x-direction and five columns extending along the y-direction.

Figure 4A:
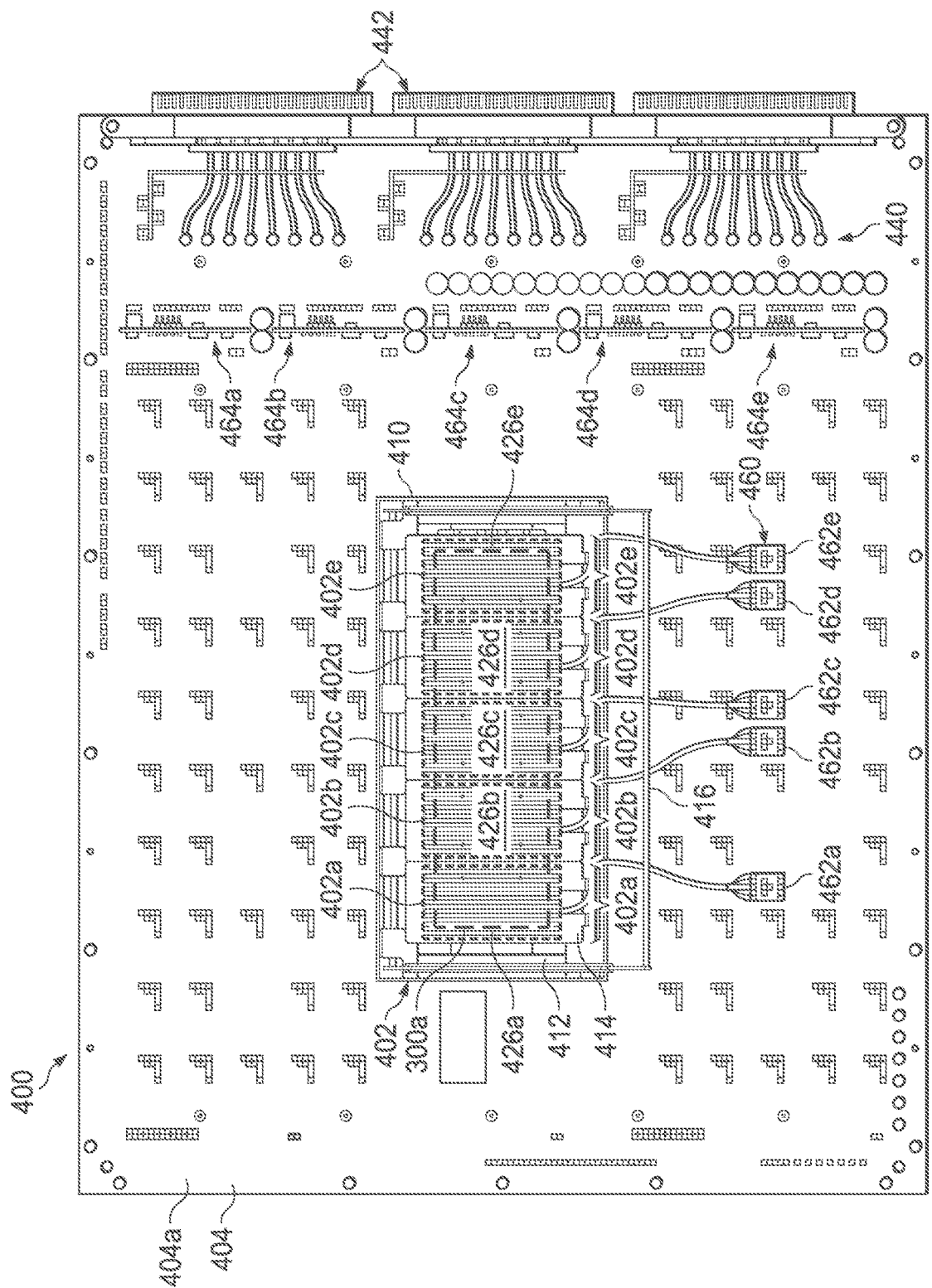
FIGS. 4A and 4B show a top side and bottom side, respectively, of an example burn-in board according to one embodiment.
Figure 4B:
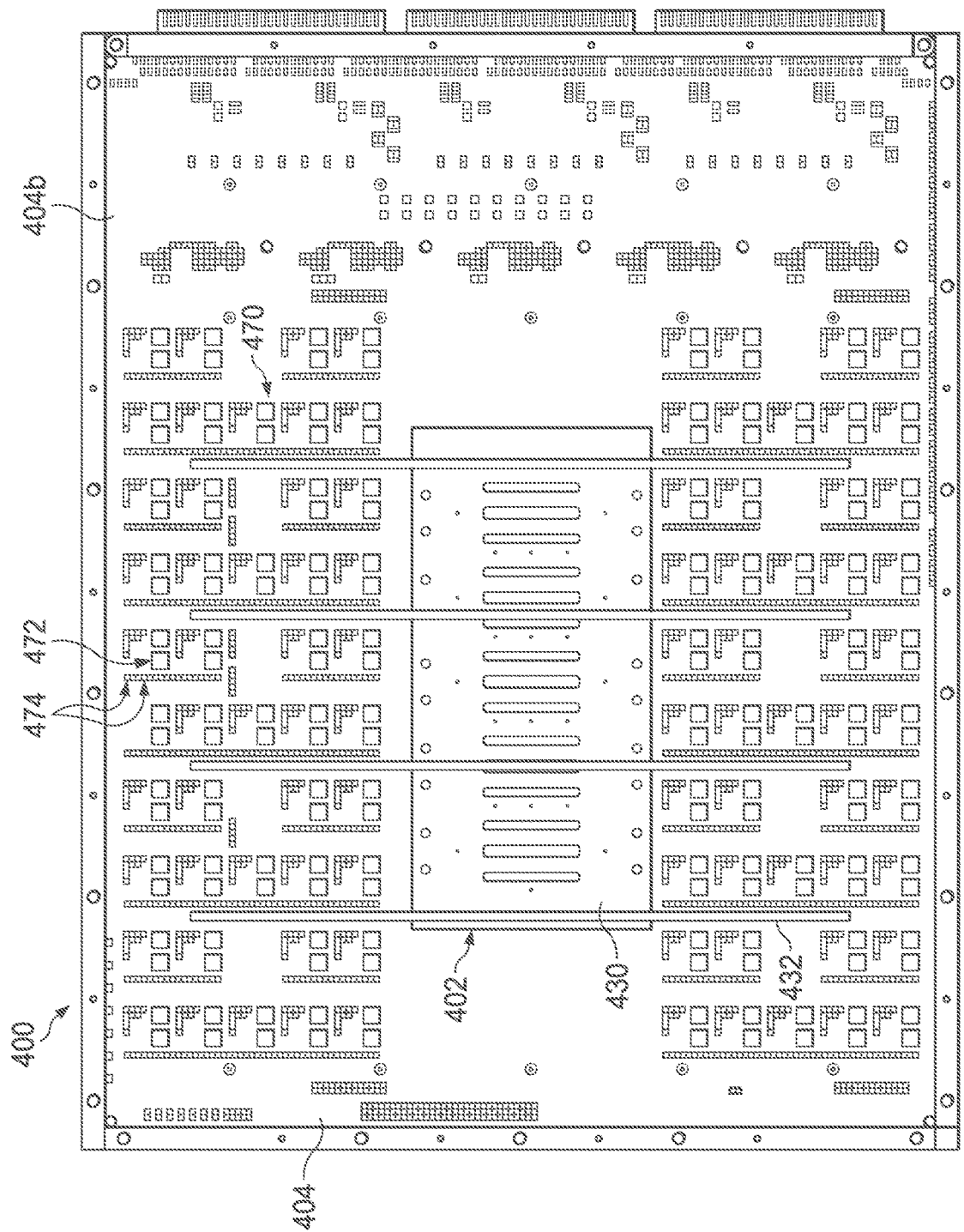

FIGS. 4A and 4B show an example burn-in board 400 according to one embodiment of the invention. In particular, FIG. 4A shows a first side 404a (e.g., top side) of burn-in board 400, and FIG. 4B shows a second side 404b (e.g., bottom side) burn-in board 400. The example burn-in board 400 includes a clamshell-type heated strip socket 402 (illustrated as a clamshell-type, and shown in closed position) mounted to PCB 404, and related circuitry for heating and testing a device strip mounted in the strip socket 402.

As shown in FIG. 4A, a main body 410 of the heated strip socket 402 is mounted on the first side 404a of PCB 404. The main body 410 includes a socket base 412 mounted to the first side 404a of PCB 404, and a socket lid 414 and a handle 416 each pivotally connected to the socket base 412. The socket lid 414 and socket handle 416 are configured to be manually moved between (a) an open position allowing a device strip to be mounted in the strip socket 402, in particular on a contactor plate provided in the socket base 412 (e.g., as shown in FIGS. 5A, 6A, and 8A-8B discussed below) and (b) a closed position in which the device strip is mounted in the strip socket 402, in particular on the contactor plate provided in the socket base 412 (e.g., as shown in FIGS. 5B-5C and 7B discussed below).

In the illustrated example, heated strip socket 402 is configured to receive the example device strip 300a shown in FIG. 3A, for heating and testing the devices 302 on device strip 300a. FIG. 4A shows device strip 300a (indicated by dashed lines) mounted on a contactor plate (not shown) below the socket lid 414 shown in the closed position.

At least one heating block may be formed in, or mounted to, the socket lid 414, for heating the devices 302 on device strip 300a. Thus, heated strip socket 402 may be referred to as heated strip socket 402. In this embodiment, heated strip socket 402 includes five strip socket sections 402a-402e, each configured for selectively heating and testing a respective device panel 306a-306e on device strip 300a. For example, each strip socket section 402a-402e may include a respective heating block 420a-420e configured to heat a respective device panel 306a-306e. Heating blocks 420a-420e may be formed in, or mounted to, an underside of the socket lid 414 (thus heating blocks 420a-420e are indicated by dashed lines in FIG. 4A), as shown more explicitly in FIGS. 5A and 5B discussed below. Each heating block 420a-420e may have an associated heat sink 426a-426e mounted on a top side of the socket lid 414, wherein each heat sink 426a-426e is thermally coupled to a respective one of the heating blocks 420a-420e.

As shown in FIG. 4B, heated strip socket 402 may include a socket bottom 430 and isolation bars 432 mounted on the second side 404b of PCB 404. The socket bottom 430 and isolation bars 432 may provide structural integrity to the burn-in board 400 and distribute physical stresses throughout the PCB 404. In this embodiment, the socket bottom 430 comprises a metal plate that acts as a physical stiffener providing structural integrity to burn-in board 400. The metal plate of socket bottom 430 may be electrically isolated from conductive elements on the PCB 404 under the footprint of the metal plate, e.g., an electrically insulating sheet or spacers (e.g., insulating sheet 431 shown in FIGS. 8A-8B discussed below), to thereby prevent an electrical short. Isolation bars 432 may comprise plastic or other non-conductive bars extending substantially across a width of the PCB 404 (e.g., at least 50%, at least 75%, or at least 90% of the width of the PCB 404) to distribute physical forces across the PCB 404. In other embodiments, heated strip socket 402 may include any other physical structures to provide structural integrity to the burn-in board 400.

Burn-in board 400 may include various circuitry formed on, or mounted to, the PCB 404, including (a) heating control circuitry 460 (FIG. 4A) for operating the heating blocks 420a-420e and (b) burn-in test circuitry 470 (FIG. 4B) for testing devices 302 on the device strip 300a, e.g., to selectively send test signals to devices 302 and receive output signals from devices 302.

As shown in FIG. 4A, heating control circuitry 460 may include heating block couplers 462a-462e and thermal controllers 464a-464e mounted to the first side 404A of PCB 404. Each thermal controller 464a-464e may be connected to a respective heating block coupler 462a-462e that is connected to each heating element (e.g., coil) in a respective heating block 420a-420e, to provide independent control of each individual heating block 420a-420e, or independent control of each heating element within each heating block 420a-420e.

Burn-in test circuitry 470 may include any suitable circuitry for testing or facilitating testing of devices 302 on device strip 300a. For example, burn-in test circuitry 470 may include circuitry configured to send test input signals to selected devices 302 (e.g., selected voltages to selected device pins), receive output signals from selected devices 302 (e.g., selected voltages on selected device pins) and analyze the operation of each individual device 302. In the illustrated embodiment, burn-in test circuitry 470 includes a multiplexer system 472 and current limiters 474, and other suitable circuitry mounted on the second side 404b of PCB 404.

As noted above, example device strip 300a includes five device panels 306a-306e, each device panel 306a-306e includes 18 devices clusters, each device cluster including 13 devices 302. In the illustrated embodiment, multiplexer system 472 on burn-in board 400 includes at least one multiplexer for each device cluster in each device panel 306a-306e, for selectively addressing and monitoring each of the individual devices 302 in the respective 13-device cluster. For example, as discussed in more detail below with respect to FIG. 12, multiplexer system 472 may include (a) monitoring signal multiplexers configured to selectively address and monitor the performance of individual devices 302 in a device cluster, (b) power signal multiplexers configured to selectively address and monitor power signals passed through current limiters connected to each respective device 302 in the device cluster, to detect an electrical fault (e.g., short) associated with each individual device 302, and/or (c) additional multi-signal-type multiplexers configured to select the signals output by the monitoring signal multiplexers and power signal multiplexers.

The example burn-in board 400 also includes a respective current limiter 474 connected to each one of the 1,170 devices 302 on device strip 300a, where each current limiter 474 is configured to electrically isolate a respective individual device 302 from other burn-in test circuitry 470, e.g., to protect against electrical shorts at individual devices 302, as discussed in more detail below regarding FIG. 12. In some embodiments, each current limiter 474 may be a smart solid state switch configured to switch off (create an open circuit) in response to current exceeding a defined threshold, e.g., due to mechanical or electrical short in the respective device 302, to thereby protect the driver (including a power supply) connected to that device 302. Each current limiter 474 may be configured to output a digital signal (e.g., signal 1204 shown in FIG. 12 discussed below) indicating an overcurrent fault (e.g., caused by a short) associated with the corresponding device 302. In one embodiment each current limiter 474 comprises a MIC2090 chip (50 mA Current Limiting Power Distribution Switch) provided by Microchip Technology Inc having a headquarters in Chandler, Ariz.

Burn-in board 400 may also include interface circuitry 440 for providing an electrical interface between the PCB circuitry (e.g., heating control circuitry 460 and burn-in test circuitry 470) and at least one card edge connector 442 or other external connection device, which may be connected to an external control system (e.g., an interface board and tester driver provided in a burn-in test machine, for example a burn-in test bench including burn-in test electronics, for example as embodied in a "tester driver," for performing burn-in testing of individual devices 302 on the device strip 300a. An example arrangement between burn-in-board 400 and a tester driver provided in a burn-in test machine is discussed below with reference to FIG. 10.

As discussed below, socket base 412 may include conductive device contacts, e.g., spring-loaded contact pins, providing an electrical connection between each individual device 302 on device strip 300a and circuitry on burn-in board 400, e.g., burn-in test circuitry 470. Burn-in test circuitry 470 may thus include circuitry connecting each conductive device contact (configured to contact a single device 302) to a corresponding one of current limiters 474 and at least one corresponding multiplexer of multiplexer system 472.

Figure 5A:
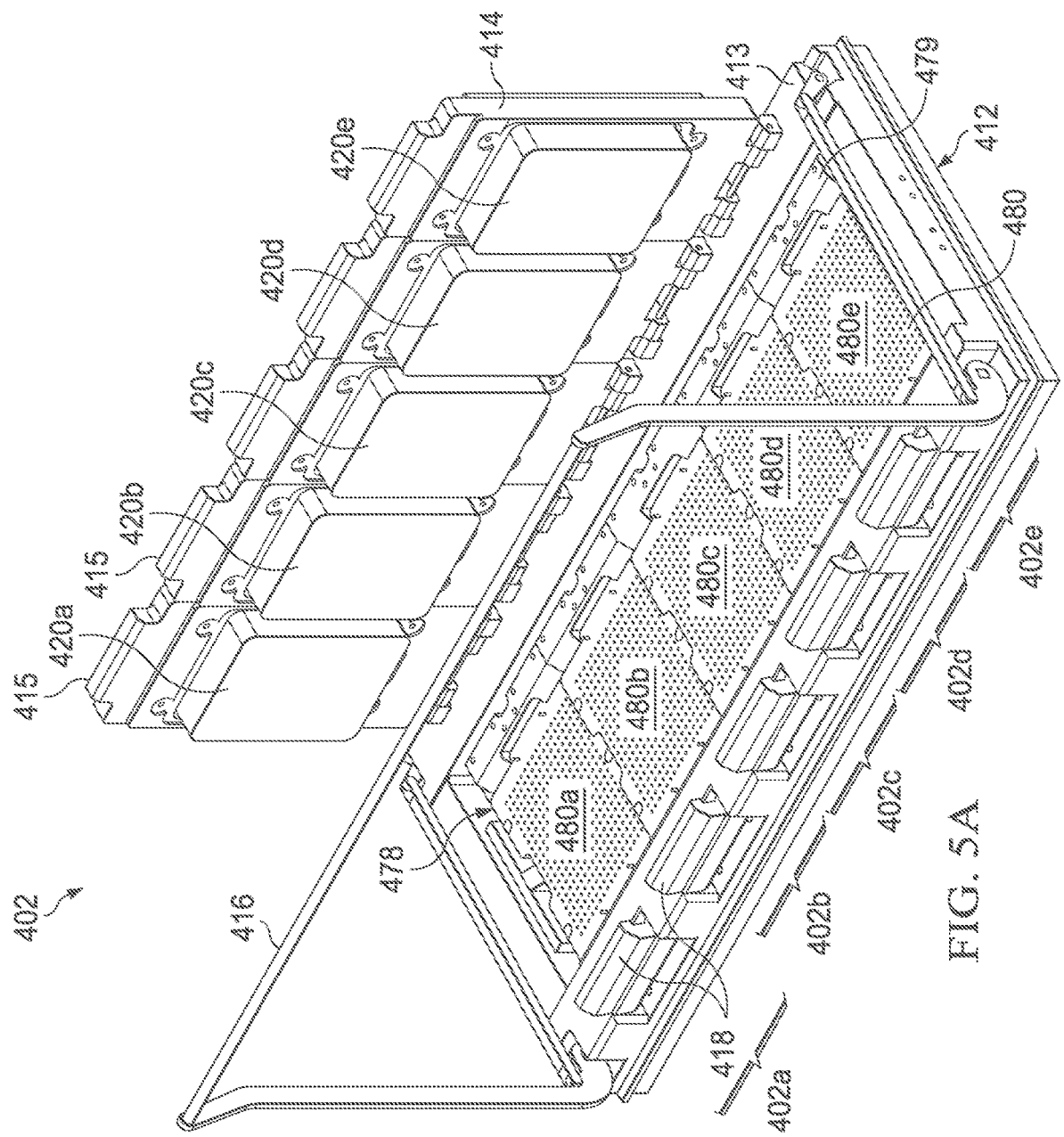
FIGS. 5A-5C show an example process for mounting a device strip in an example clamshell-type strip socket.
Figure 5B:
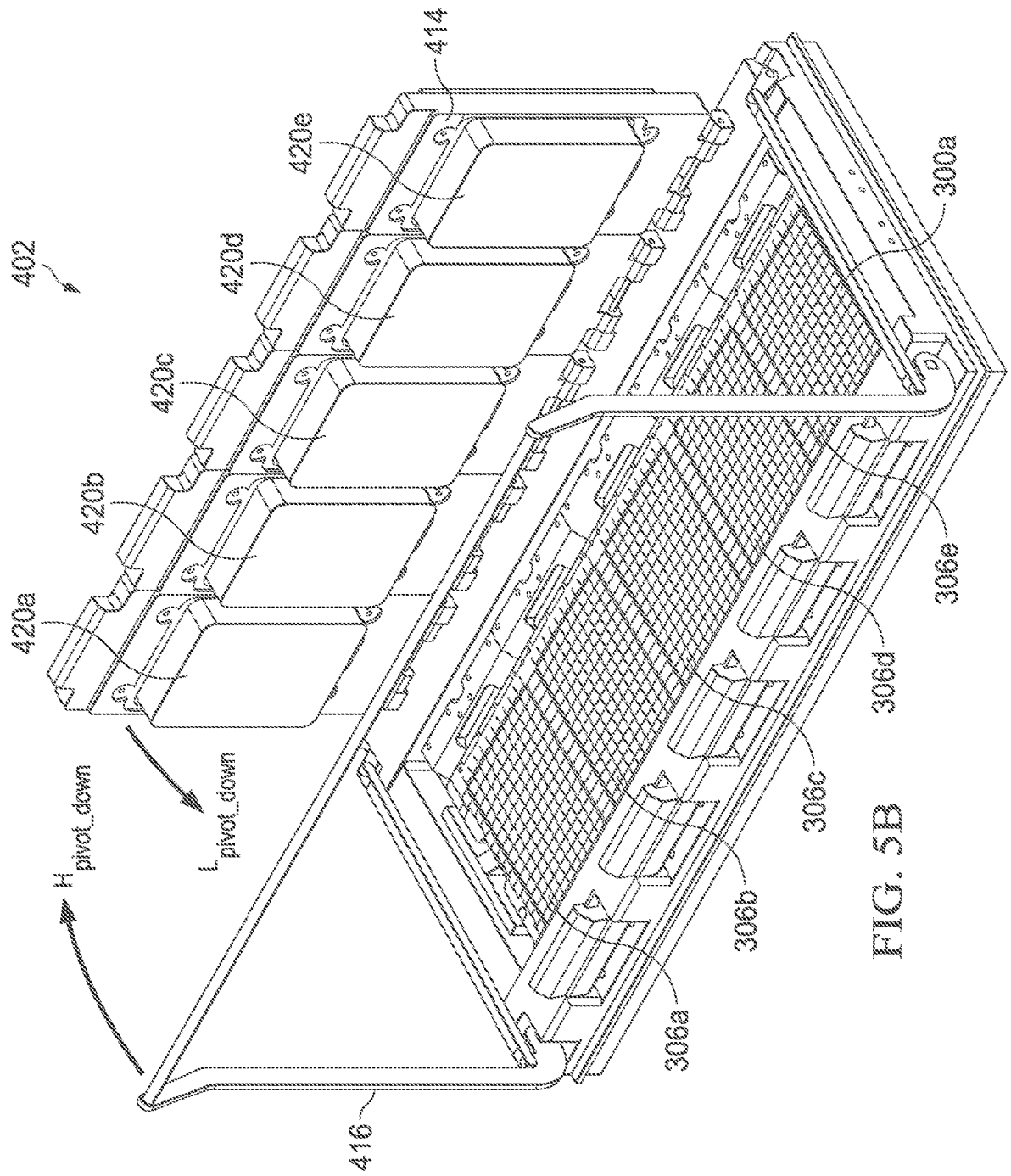
Figure 5C:
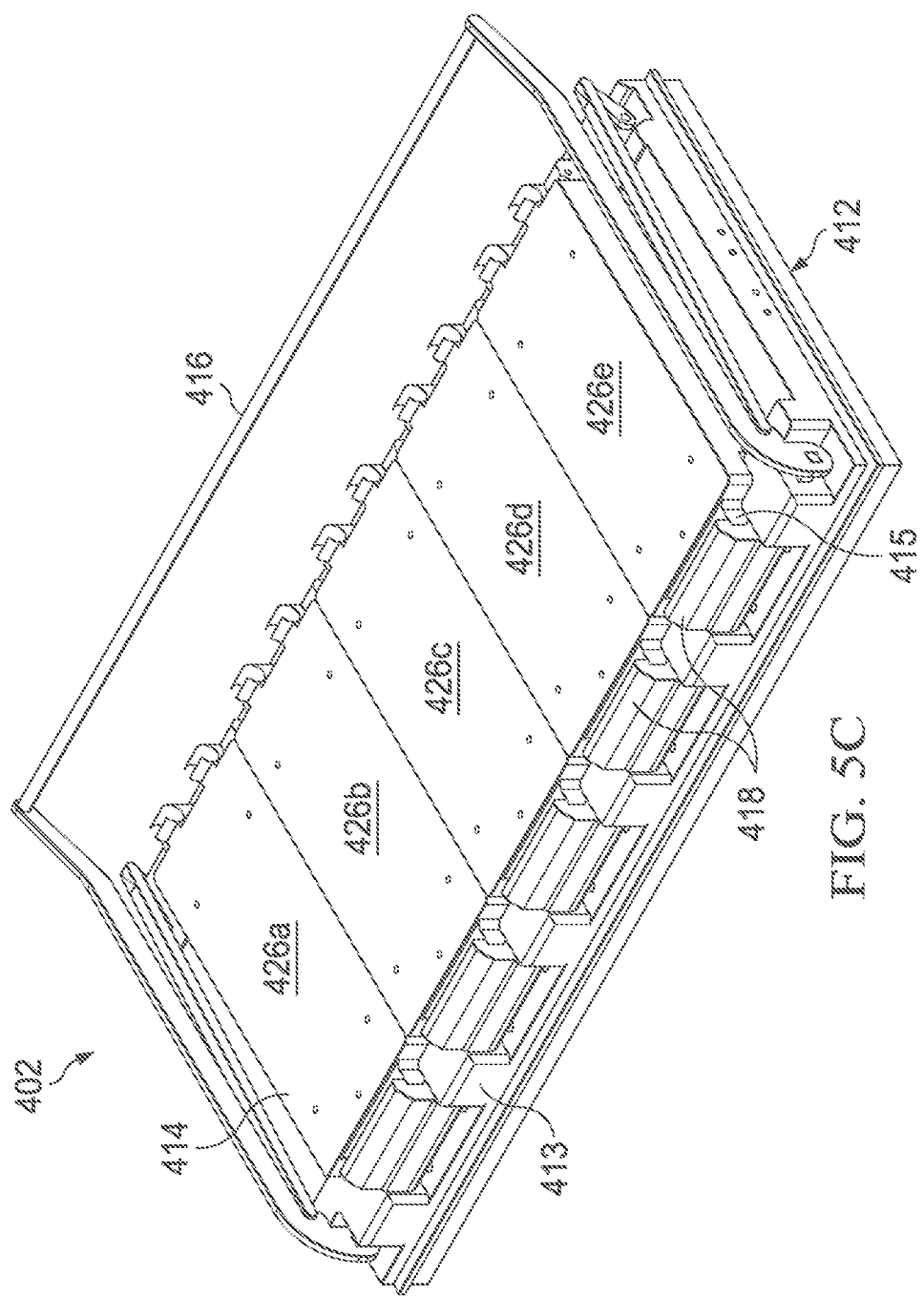

FIGS. 5A-5C show an example process for mounting device strip 300a in the example clamshell-type heated strip socket 402 shown in FIGS. 4A-4B. In particular, FIG. 5A shows heated strip socket 402 in an open position before device strip 300a is mounted therein; FIG. 5B shows device strip 300a mounted in strip socket 402, while heated strip socket 402 is still in the open position; and FIG. 5C shows heated strip socket 402 in a closed position with device strip 300a mounted therein, e.g., after being closed using socket handle 416, according to one example embodiment.

Figure 8A:
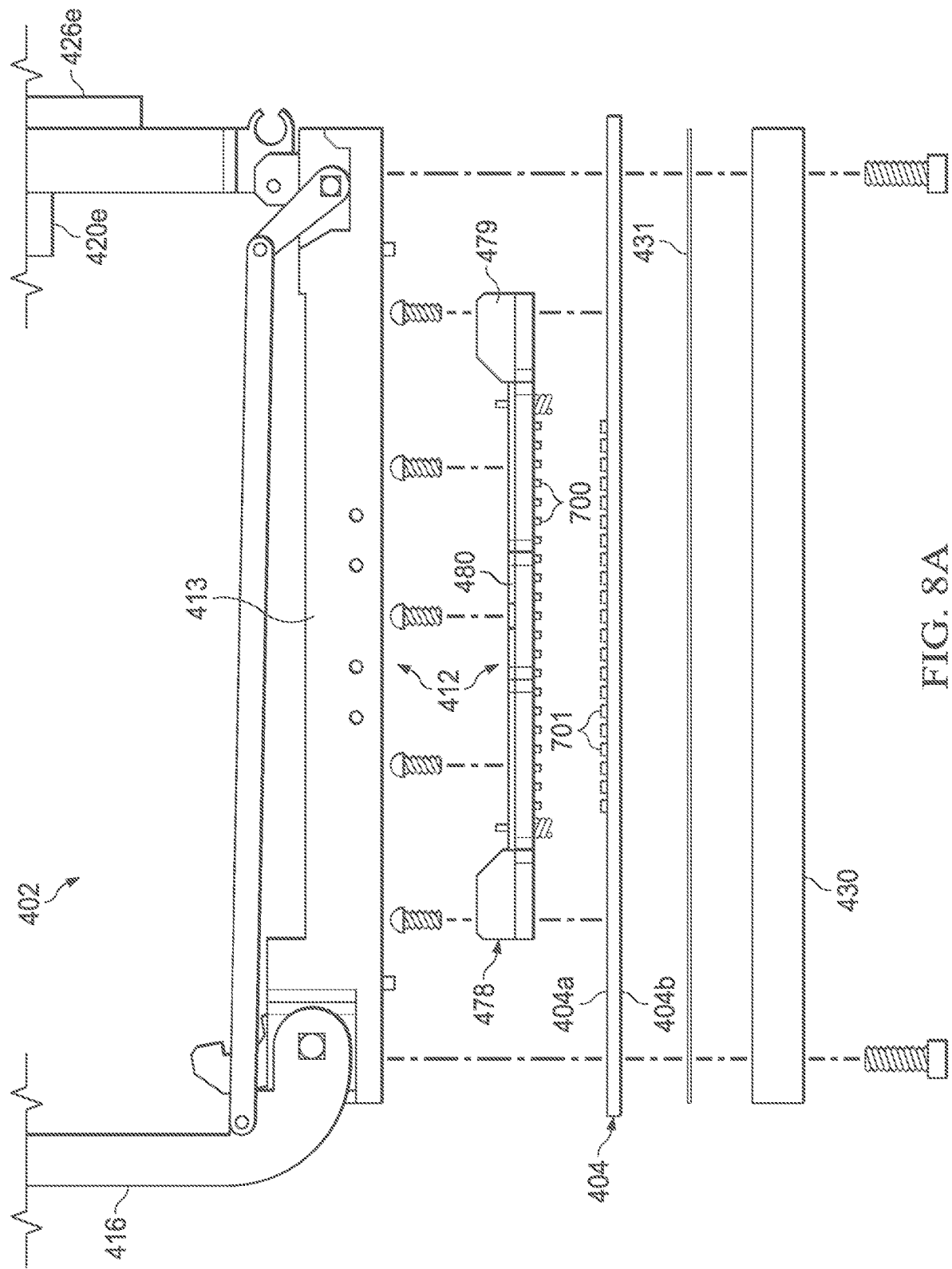
FIGS. 8A and 8B are exploded assembly drawings for an example strip socket according to one example embodiment.
Figure 8B:
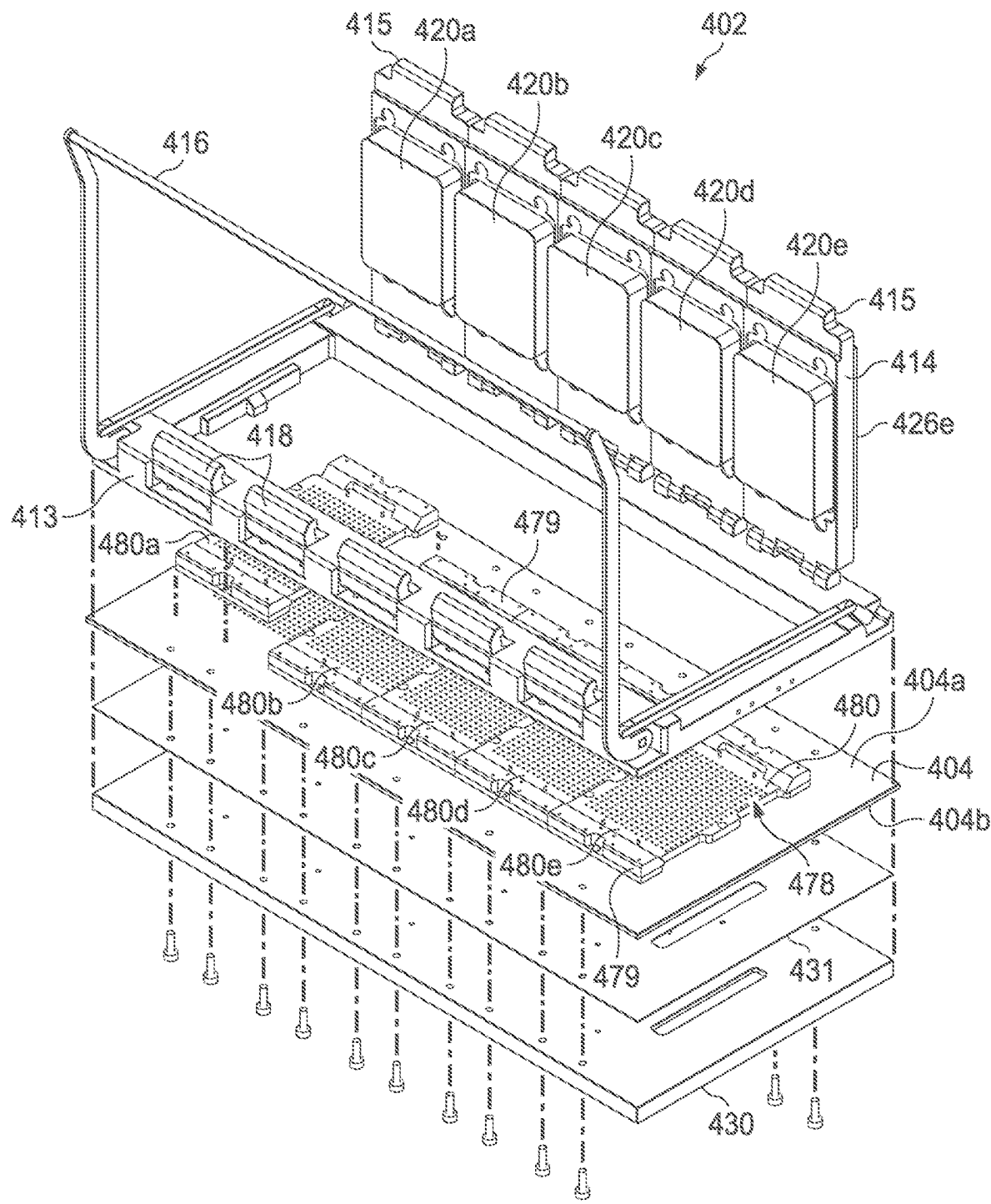

As shown in FIGS. 5A-5C, the socket base 412 may include a socket base body 413 and a device strip support 478. The device strip support 478 may include a contactor plate 480 supported on a contactor plate base 479. The contactor plate 480 may be configured to receive the device strip 300a mounted thereon. The socket base body 413 and device strip support 478 may be distinct structures, e.g., as shown in FIGS. 8A-8B, or may be a single integrated component. The socket lid 414 and socket handle 416 are each pivotally connected to the socket base body 413. The socket base 412 may also include lid clamps 418 configured to receive and secure locking tabs 415 formed on a distal end of the socket lid 414 when socket lid 414 and socket handle 416 are pivoted to a closed position. The lid clamps 418 may be mechanically connected to the socket handle 416 such that they rotate and move downwardly when the socket handle 461 is pivoted downwardly, as discussed below.

The contactor plate 480 may include five contactor plate sections 480a-480e, each configured to align with a respective device panel 306a-306e of device strip 300a mounted on the contactor plate 480. As discussed above, five heating blocks 420a-420e may be formed in, or mounted to, an underside of the socket lid 414, each corresponding with a respective device panel 306a-306e on device strip 300a when mounted on contactor plate 480.

Referring to FIG. 5B, device strip 300a may be mounted on the device strip support 478, in particular on contactor plate 480, e.g., by manually placing device strip 300a on contactor plate 480. After mounting device strip 300a on contactor plate 480, the socket lid 414 may be manually pivoted down onto the device strip 300a, as indicated by arrow $L_{pivot\_down}$ such that the locking tabs 415 are aligned with corresponding lid clamps 418. The socket handle 416 may then be manually pivoted down, as indicated by arrow $H_{pivot\_down}$, which causes the lid clamps 418 to rotate and translate downwardly to lock the locking tabs 415 (and thus socket lid 414) into a closed position, as shown in more detail in FIGS. 7A-7B discussed below. The resulting closed socket position is shown in FIG. 5C, in which socket lid 414 in locked in the closed position by locking tabs 415 and socket handle 416. The downward translation of the lid clamps 418 (caused by the downward pivoting of the socket handle 416) may force the locking tabs 415, and thus socket lid 414, downward, which may press the heating blocks 420a-420e downward against the mounted device strip 300a to provide or improve a physical contact (and thus an electrical contact) between devices 302 on device strip 300a and underlying conductive device contacts, e.g., spring-loaded contact pins, as discussed below with reference to FIGS. 7A-7B.

Figure 6A:
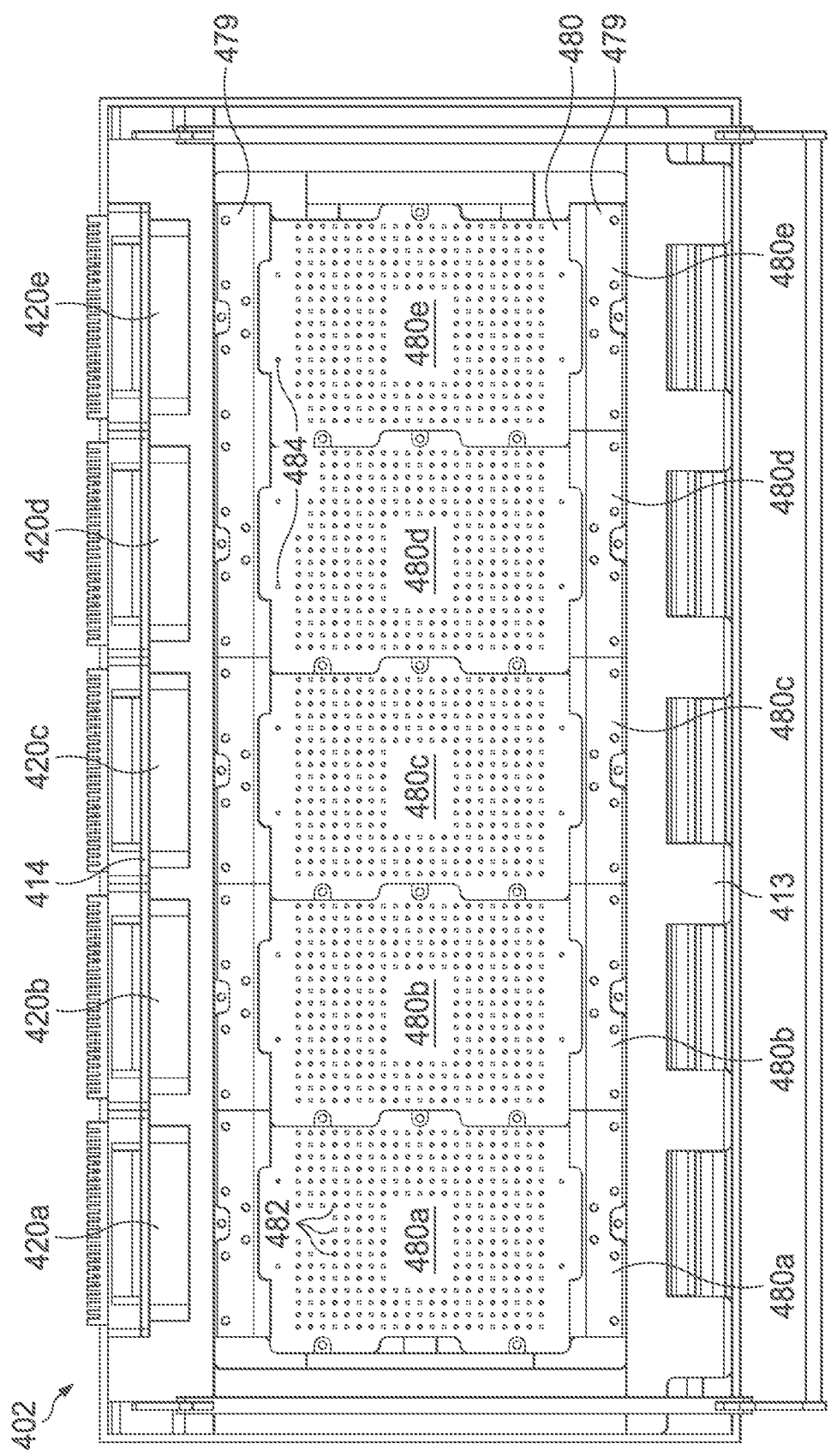
FIGS. 6A and 6B show top views of a strip socket in the open position, prior to mounting a device strip on a contactor plate (FIG. 6A) and after mounting the device strip on the contactor plate (FIG. 6B)
Figure 6B:
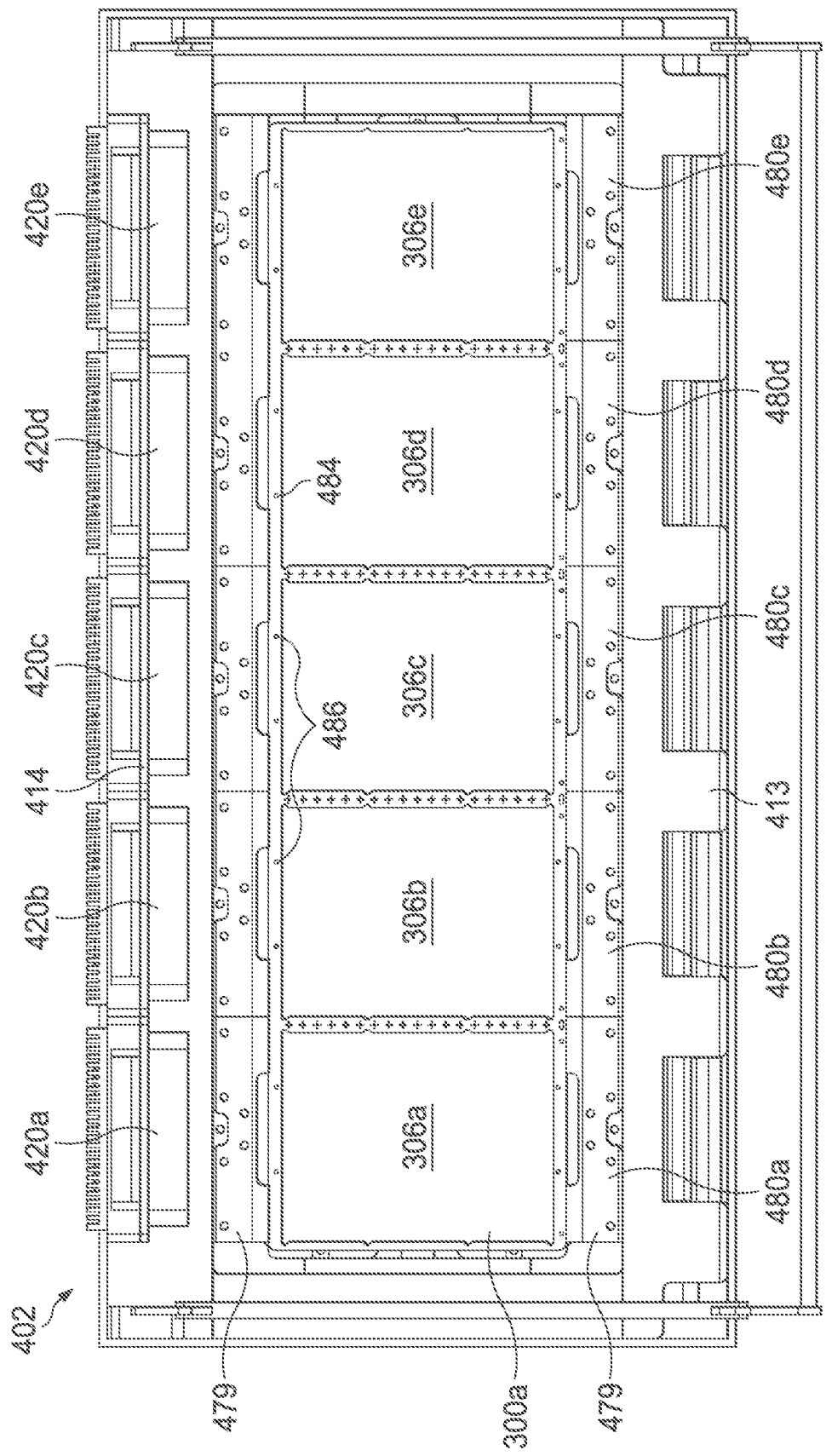

FIGS. 6A and 6B show top views of heated strip socket 402 in the open position, prior to mounting device strip 300a on device strip support 478, in particular on the contactor plate 480 including contactor plate sections 480a-480e (FIG. 6A), and after mounting device strip 300a on the contactor plate 480 (FIG. 6B). As shown in FIG. 6A, device strip support 478 includes contactor plate 480 supported on contactor plate base 479. Contactor plate 480 includes an array of device contact holes 482 corresponding with the array of devices 302 on device strip 300a, and alignment elements 484 (e.g., upwardly-extending bumps or protrusions).

As shown in FIG. 6B, device strip 300a may include holes or slots 486 configured to receive alignment elements 484 on contactor plate 480, to physically align device strip 300a relative to contact holes 482 in contactor plate 480 and thus relative to underlying conductive device contacts (e.g., spring-loaded contact pins). Thus, when manually mounting device strip 300a onto contactor plate 480, the user may align the holes or slots 486 in device strip 300a with the alignment elements 484 on contactor plate 480, to properly align device strip 300a on the contractor plate 480.

Figure 7A:
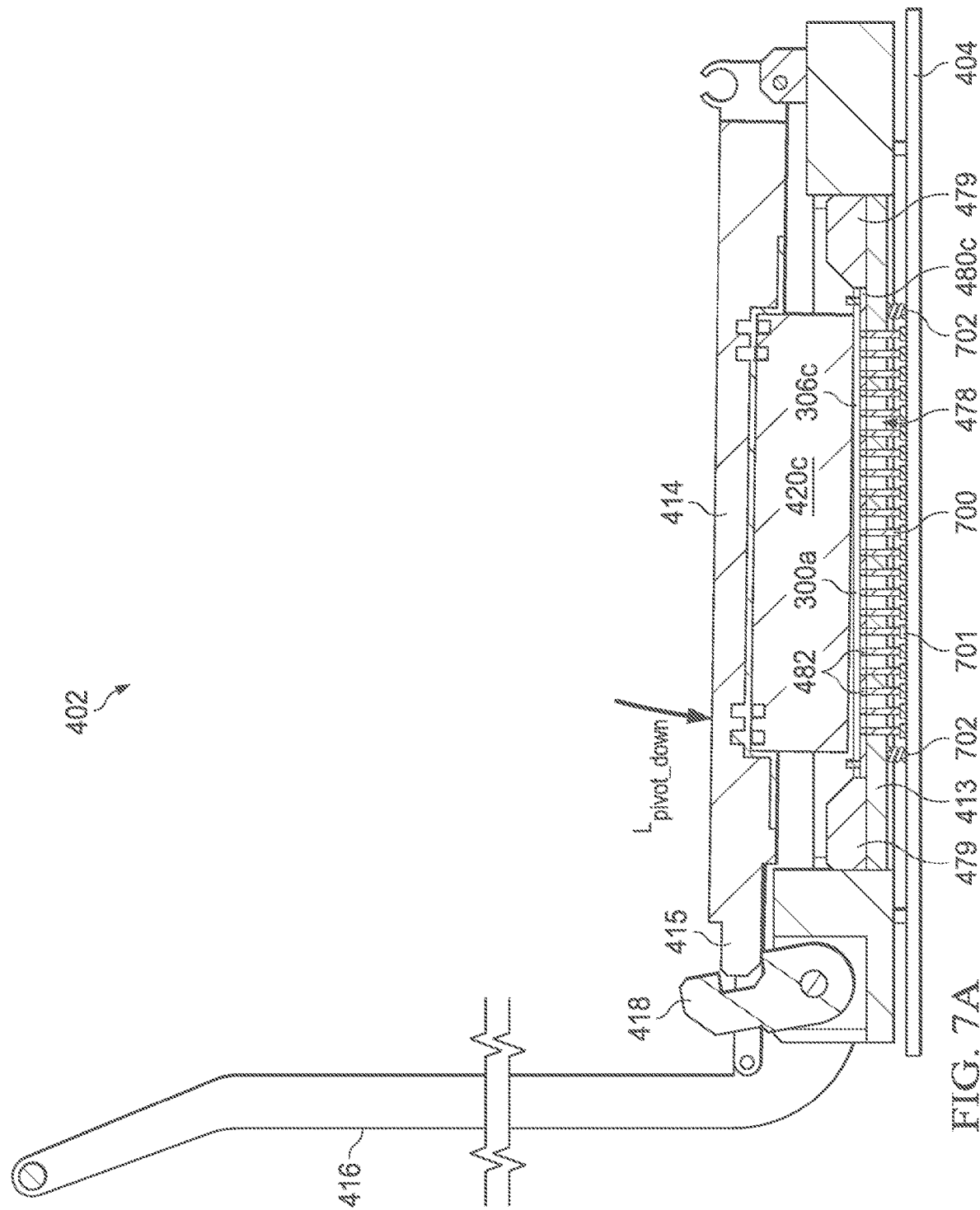
FIGS. 7A and 7B shows side cross-sectional views of a strip socket illustrating the closing of the socket lid onto a device strip mounted on a contactor plate, according to one example embodiment.
Figure 7B:
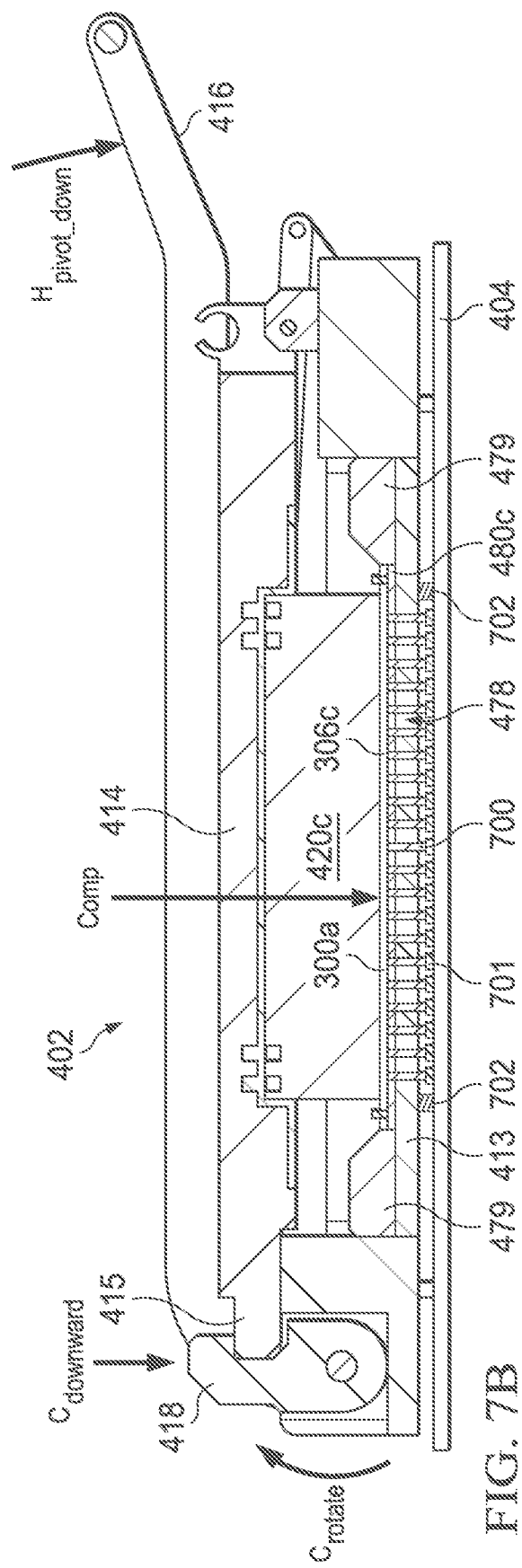

FIGS. 7A and 7B shows side cross-sectional views of heated strip socket 402 mounted on PCB 404, illustrating the closing of the socket lid 414 onto a device strip 300a mounted on contactor plate 480 of socket base 412, according to one example embodiment. The cross-sectional views are taken at a centerpoint along the width of the strip socket 402, and thus cuts through heating block 420c on the bottom side of socket lid 414.

FIG. 7A shows the socket lid 414 with heating block 420c pivoted down onto device panel 306c mounted on contactor plate section 480c of device strip support 478, as indicated by the arrow $L_{pivot\_down}$, such that locking tabs 415 on socket lid 414 are aligned with corresponding lid clamps 418 provided in socket base 412. Contactor plate section 480c may be supported by spring-loaded or elastic members 702 mounted on PCB 404 and configured to translate downwardly in response to a downward force from above, as shown in FIG. 7B discussed below.

The device strip support 478 also includes an array of conductive device contacts 700, e.g., spring-loaded contact pins, arranged below the contactor plate section 480c and mounted or bonded to respective metal contacts 701 formed on PCB 404. The metal contacts 701 are connected to respective circuitry on burn-in board 400, including burn-in test circuitry 470, for sending test signals to, and receiving test signals from, each individual device 302 (or individual pins on each device 302) on device strip 300a via respective conductive device contacts 700 (spring-loaded contact pins).

As shown in FIG. 7B, a user may lower and press the handle 416 downward to a closed position as indicated by the arrow $H_{pivot\_down}$. The socket handle 416 is mechanically connected to the lid clamps 418 such that the downward movement of the socket handle 416 ($H_{pivot\_down}$) causes the lid clamps 418 to both rotate (as indicated by arrow $C_{rotate}$) and translate downwardly (as indicated by arrow $C_{downward}$) to (a) lock the locking tabs 415 into the lid clamps 418 and (b) push the socket lid 414 downward. As indicated by the arrow labelled "Comp" (compression) in FIG. 7B, the downward movement of the socket lid 414 forces heating block 420c downward against the device panel 306c, which pushes device panel 306c and contactor plate section 480c downward, thereby compressing the spring-loaded or elastic members 702 supporting contactor plate section 480c. As device strip 300a and contactor plate section 480c move downward, conductive device contacts 700 (spring-loaded contact pins) project up through corresponding contact holes 482 in the contactor plate section 480c, and into contact with devices 302 on device strip 300a (e.g., to contact one or more selected pins of each device 302), to thereby provide electrical connection between individual devices 302 (or individual device pins) and various burn-in test circuitry 470, e.g., current limiters 474, multiplexer system 472, and/or other circuitry.

FIGS. 8A and 8B are exploded assembly drawings for strip socket 402, according to one example embodiment. FIG. 8A shows a side view of the assembly, while FIG. 8B shows a three-dimension view. As shown in FIGS. 8A and 8B, the strip socket assembly may include socket base 412 including socket base body 413 and device strip support 478 mounted on the top side 404a of PCB 404, and an insulation sheet 431 and stiffener 430 mounted on the bottom side 404b of PCB 404. As shown, device strip support 478 includes conductive device contacts 700 (spring-loaded contact pins) arranged below the contactor plate 480, and configured to be mounted to respective metal contacts 701 formed on PCB 404.

Figure 9A:
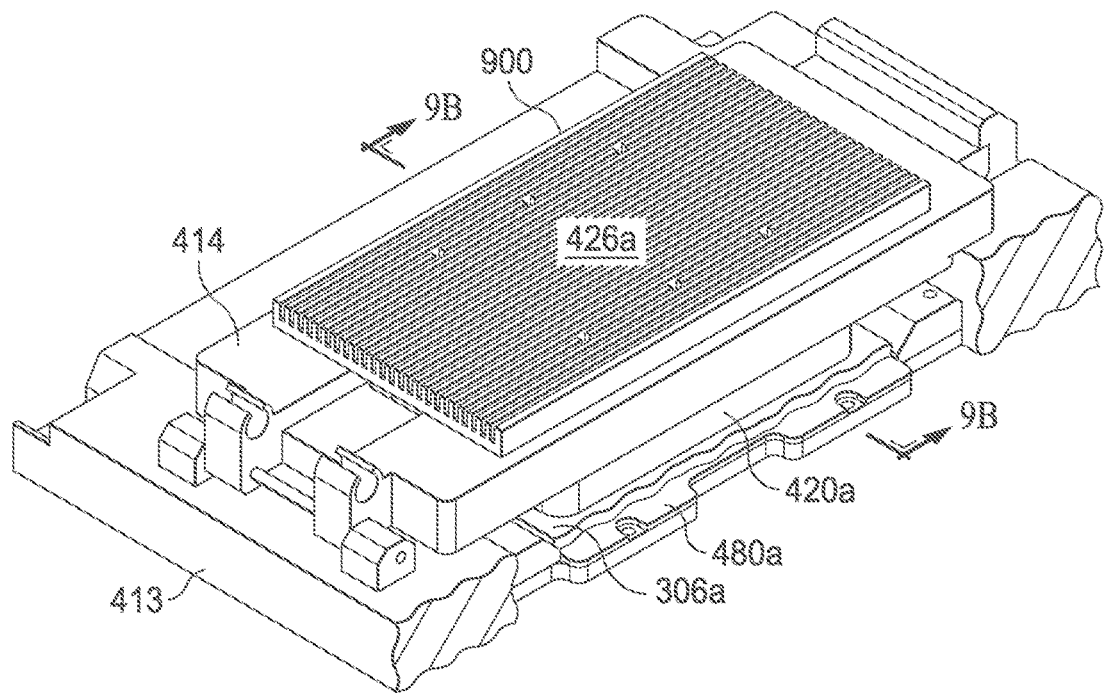
FIGS. 9A and 9B illustrate a portion of an example strip socket including a selected heating block pressed down onto a corresponding device panel of a mounted device strip, according to one example embodiment.
Figure 9B:
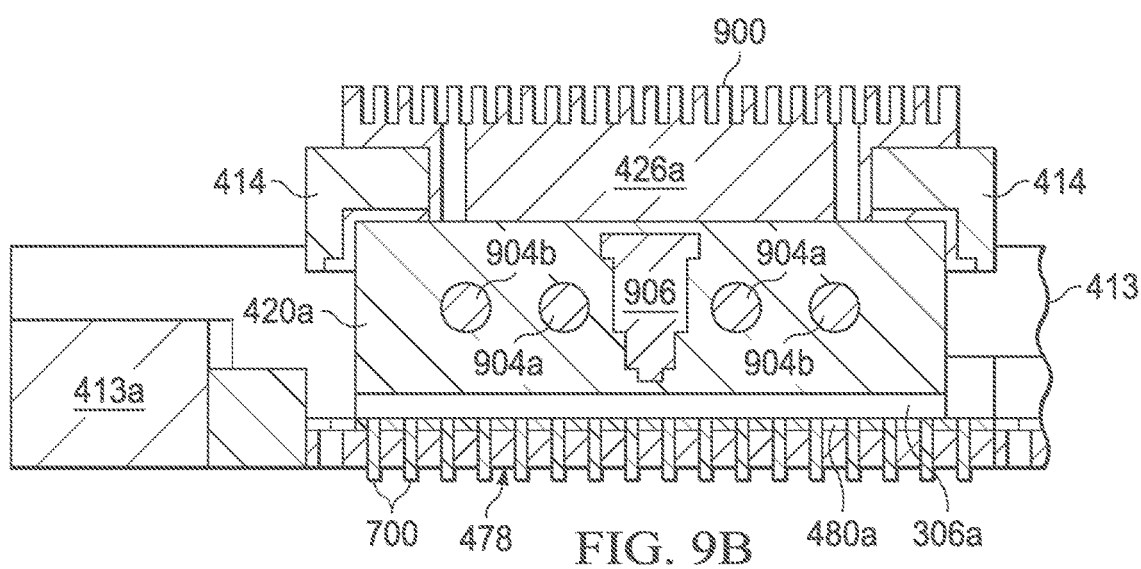

FIGS. 9A and 9B illustrate a portion of an assembled heated strip socket 402 in a closed position, in particular a portion including a selected heating block 420a pressed down onto a corresponding device panel 306a of device strip 300a arranged on a respective contactor plate section 480a of the device strip support 478, according to one example embodiment. FIG. 9A shows a three-dimensional view from above, and FIG. 9B shows a side cross-sectional through line 9B-9B shown in FIG. 9A. As shown in FIG. 9A, heating block 420a may be mounted to a lower side of the socket lid 414, and a heat sink 426a may be mounted on the heating block 420a and project above an upper side of the socket lid 414. Heat sink 426a is configured to remove heat from heating block 420a, and may include an array of fins 900.

As shown in the cross-sectional view of FIG. 9B, a pair of resistive heating elements 904a and 904b extend within the body of heating block 420a. In this example embodiment, each heating element 904a and 904b is a resistive heating coil arranged in a loop (e.g., a circular or oval loops) within heating block 420a, with heating element 904a located concentrically within heating element 904b. However, it should be understood that heating block 420a may include any number and type(s) of heating elements arranged in any suitable manner, e.g., to provide a defined heating distribution of the underlying device panel 306a, for example to provide a uniform heating of devices 302 on device panel 306a, or to provide a defined non-uniform heat distribution, e.g., a targeted heating of defined region(s) or defined device(s) 302 on device panel 306a. Heating elements 904a and 904b may be connected to suitable heating control circuitry 460 (see FIG. 4A) configured to pass a current through heating elements 904 and 904b to generate heat within heating block 420a.

As shown in FIG. 9B, at least one temperature sensor 906 may be integrated in, secured to, or provided adjacent heating block 420a. For example, heating block 420a may include one or more integrated resistance temperature detector (RTD) element 906 connected to suitable heating control circuitry 460 (see FIG. 4A) configured to pass a current through the RTD element 906 and measure the resistance of the RTD element 906, to thereby measure a temperature at an interface between the heating block 420a and underlying device panel 306a. A thermal controller 464a-464e connected to a respective heating block coupler 462a-462 (see FIG. 4A discussed above) may use temperature measurements from temperature sensor(s) 906 to dynamically adjust or otherwise control the current applied to heating elements 904a and 904b in heating block 420a, e.g., based on defined target temperature value(s).

As discussed above, by providing a burn-in board having a strip socket that includes heating block(s) for heating the devices on a device strip (e.g., burn-in board 400 having heated strip socket 402 with integrated heating blocks 420a-420e as discussed herein), burn-in testing may be performed on a device strip without the need for external heating of the device strip, e.g., using a burn-in oven. Thus, a burn-in board as disclosed herein may be used for burn-in testing of devices on a test bench (having no oven) or using a burn-in oven for electrical testing without heating the oven. By avoiding the need to expose the burn-in board to high temperatures, e.g., in a conventional burn-in oven, various types of electronics that may not function properly of effectively at elevated temperatures (e.g., as typically experienced in a thermal burn-in chamber or oven) may be mounted on the burn-in board. Such electronics include, for example, multiplexers and current limiters, such as the various multiplexers and current limiters provided on the example burn-in board 400 disclosed herein.

Figure 10A:
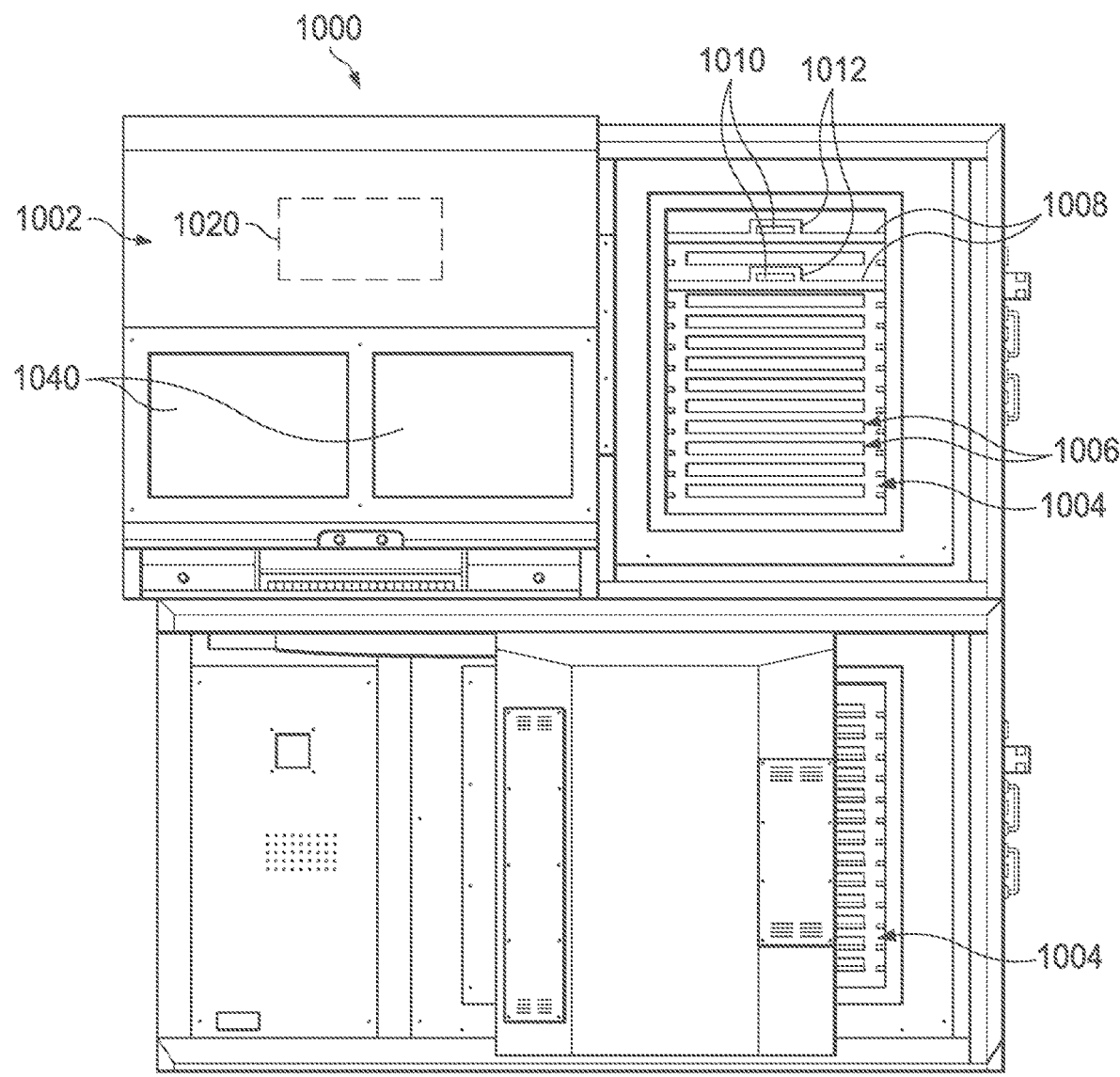
FIGS. 10A and 10B show an example system for burn-in testing of device strips mounted in strip sockets including heating blocks, wherein the strip sockets are inserted in a burn-in oven machine and tested using testing electronics of the burn-in oven machine but without heating the oven, according to one embodiment.
Figure 10B:
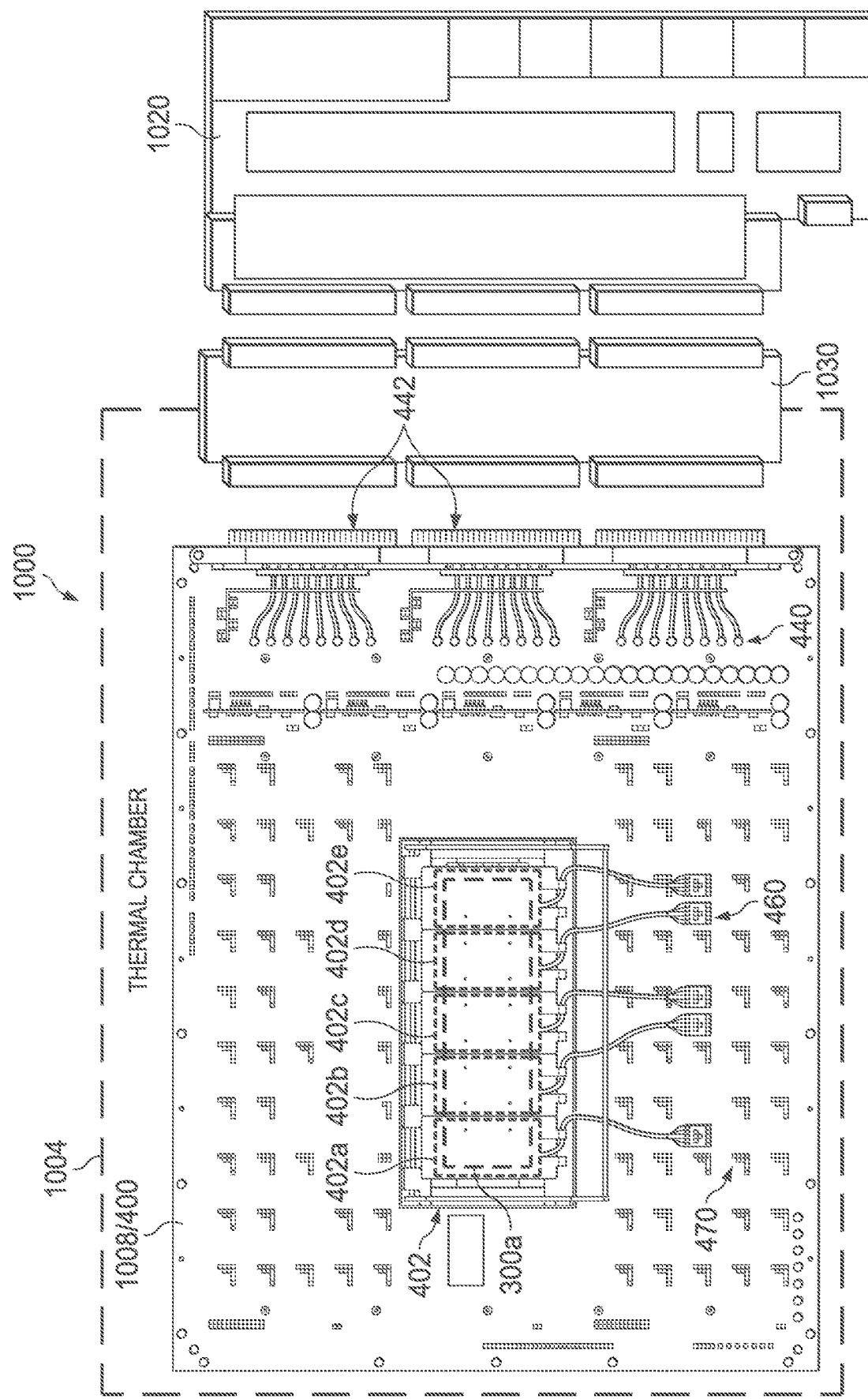

FIGS. 10A and 10B show an example burn-in oven system 1000 for burn-in testing of device strips mounted in strip sockets having integrated heating blocks as disclosed herein, using the testing electronics of the burn-in oven system but without heating the thermal chambers of the burn-in oven system 1000, according to one embodiment. As shown in FIG. 10A, burn-in oven system 1000 may a burn-in oven machine 1002 (for example an Art Burn-In Oven by ELES S.p.A. located in Todi, Italy) including testing electronics 1020 and at least one thermal chamber (oven) 1004 each including a plurality of burn-in board slots 1006 (e.g., 18 slots), and at least one burn-in board 1008 each received in a respective burn-in board slot 1006. For example, FIG. 10A shows two burn-in boards 1008 inserted in two respective burn-in board slots 1006.

Each burn-in board 1008 may include a device strip 1010 mounted in a heated strip socket 1010. Burn-in boards 1008 in different slots 1006 may include different types or sizes of heated strip sockets 1010 configured for supporting and testing different types or sizes of device strips 1010 including different types of semiconductors devices (e.g., chips or dies). For example, one or more burn-in board 1008 may including a heated strip socket 1010 similar to example heated strip socket 402 discussed above, e.g., for testing any of the example device strips 300a-300c shown in FIGS. 3A-3C and/or any other types of device strips including any one or more types of semiconductors devices. Thus, in some implementations, multiple different types of semiconductor devices or device strips mounted in heated strip sockets 1010 on different burn-in boards 1008 inserted in multiple in board slots 1006 may be tested simultaneously in the burn-in oven machine 1002.

As shown in FIG. 10B, each burn-in board 1008 may be connected to testing electronics 1020, e.g., a tester driver, provided in the burn-in oven machine 1002. The example burn-in board 1008 shown in FIG. 10B corresponds with burn-in board 400 discussed above, and thus includes a test strip 300a mounted in a heated strip socket 402 including heating blocks 420a-420e, along with heating control circuitry 460 and burn-in test circuitry 470 connected to card edge connectors 442 via interface circuitry 440. In the example system 1000 shown in FIG. 10B, burn-in board 1008 is connected to testing electronics 1020 via an interface board 1030, which may include a physical and electrical interface configured to receive or otherwise connect with card edge connectors 442 provided on burn-in board 1080, thereby providing electrical connections between testing electronics 1020 and burn-in board circuitry (e.g., heating control circuitry 460 and burn-in test circuitry 470 discussed above) via suitable card edge connectors 442 and interface circuitry 440.

To perform burn-in testing of devices on device strip 300a, testing electronics 1020 may (a) signal heating control circuitry 460 to control heating blocks 420a-420e to heat the device strip 1010 (or selected device panels or other portions thereof), e.g., to defined temperatures, and (b) signal burn-in test circuitry 470 to perform various electrical testing of individual devices 302 on device strip 300a. Testing electronics 1020 may include electrical fault detection circuitry configured to detect an electrical fault associated with each individual device 302 (e.g., based on fault detect signals output by current limiters 474, as discussed below) and device performance monitoring circuitry configured to measure an operational performance of each individual device (e.g., based on performance monitoring output signals 1312 output by each device 302, as discussed below). Testing electronics 1020 may be configured to generate output data indicating the operational performance and/or fault status of each device 302, which data may be displayed on display screen(s) 1040 of the burn-in oven system 1000 (see FIG.

10A) and/or accessible or downloadable by another computer, e.g., by wired or wireless connection to the burn-in oven system 1000.

Because the device strip 300a mounted in the heated strip socket 402 is heated by the integrated heating blocks 420a-420e, testing electronics 1020 may perform the burn-in testing without heating the thermal chamber 1004, which may provide various advantageous. For example, as noted above, such testing configuration and procedure may allow the inclusion of various electronics on burn-in board 404 (e.g., various heating control circuitry 460 and burn-in test circuitry 470) that may be unable to tolerate typical temperatures experienced in the thermal chamber 1004. In addition, by providing multiple burn-in boards 1008 with heated strip sockets arranged in a burn-in oven machine 1002, multiple device strips may be simultaneously exposed to different temperatures or temperature profiles during a burn-in test, e.g., to efficiently determine device performance or failure at different temperatures or temperature profiles.

Figure 11:
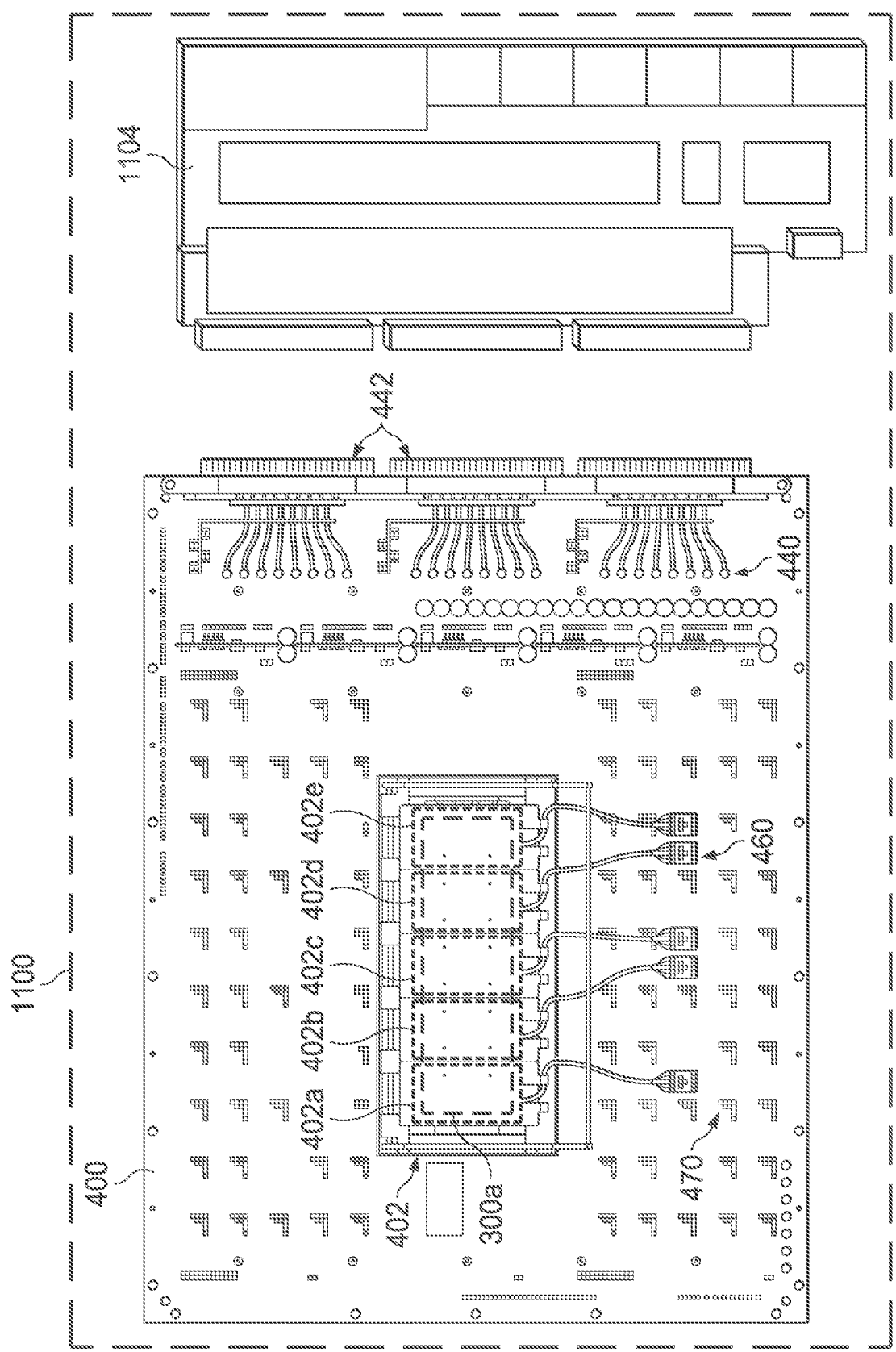
FIG. 11 shows an example test bench for burn-in testing of a device strip arranged in a strip socket including heating blocks, according to one embodiment.

As discussed above, in addition or alternatively to testing in a burn-in oven machine, burn-in boards according to the present disclosure may be tested on a test bench or other non-oven-based test machine. For example, FIG. 11 shows an example test bench 1100 for burn-in testing of a device strip 300a arranged in the example heated strip socket 402 provided on the example burn-in board 404 discussed above, according to one embodiment. Test bench 1100 may including testing electronics 1104, e.g., a tester driver, for performing burn-in testing of individual devices on device strip 300a. To perform burn-in testing of devices on device strip 300a, testing electronics 1104 may (a) signal heating control circuitry 460 to control heating blocks 420a-420e to heat the device strip 1010 (or selected device panels or other portions thereof), e.g., to defined temperatures, and (b) signal burn-in test circuitry 470 to perform various electrical testing of individual devices on device strip 300a, e.g., as discussed above.

Figure 12:
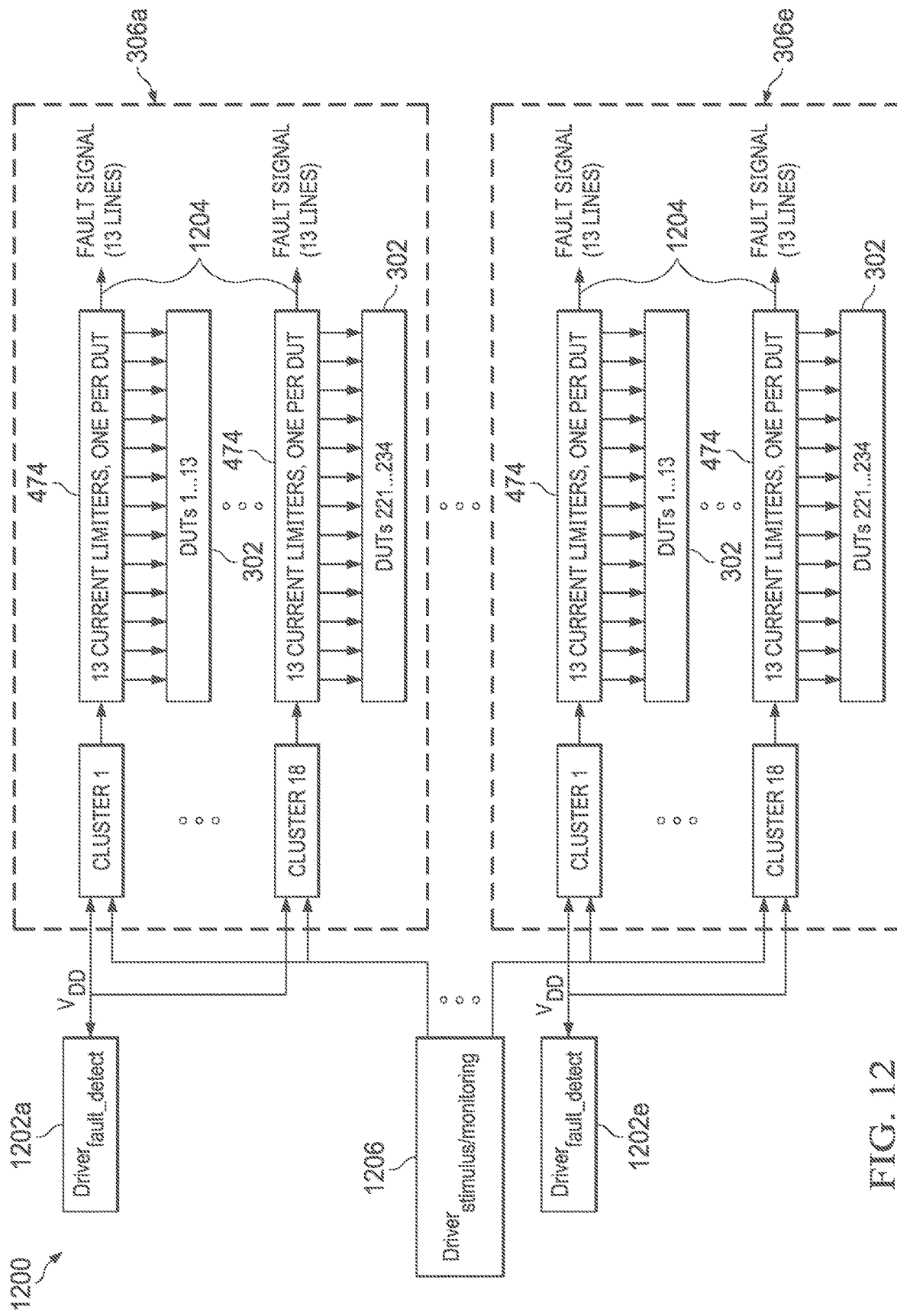
FIG. 12 shows an example power supply system for an example device strip mounted in a strip socket on an example burn-in board, according to one example embodiment.
Figure 13:
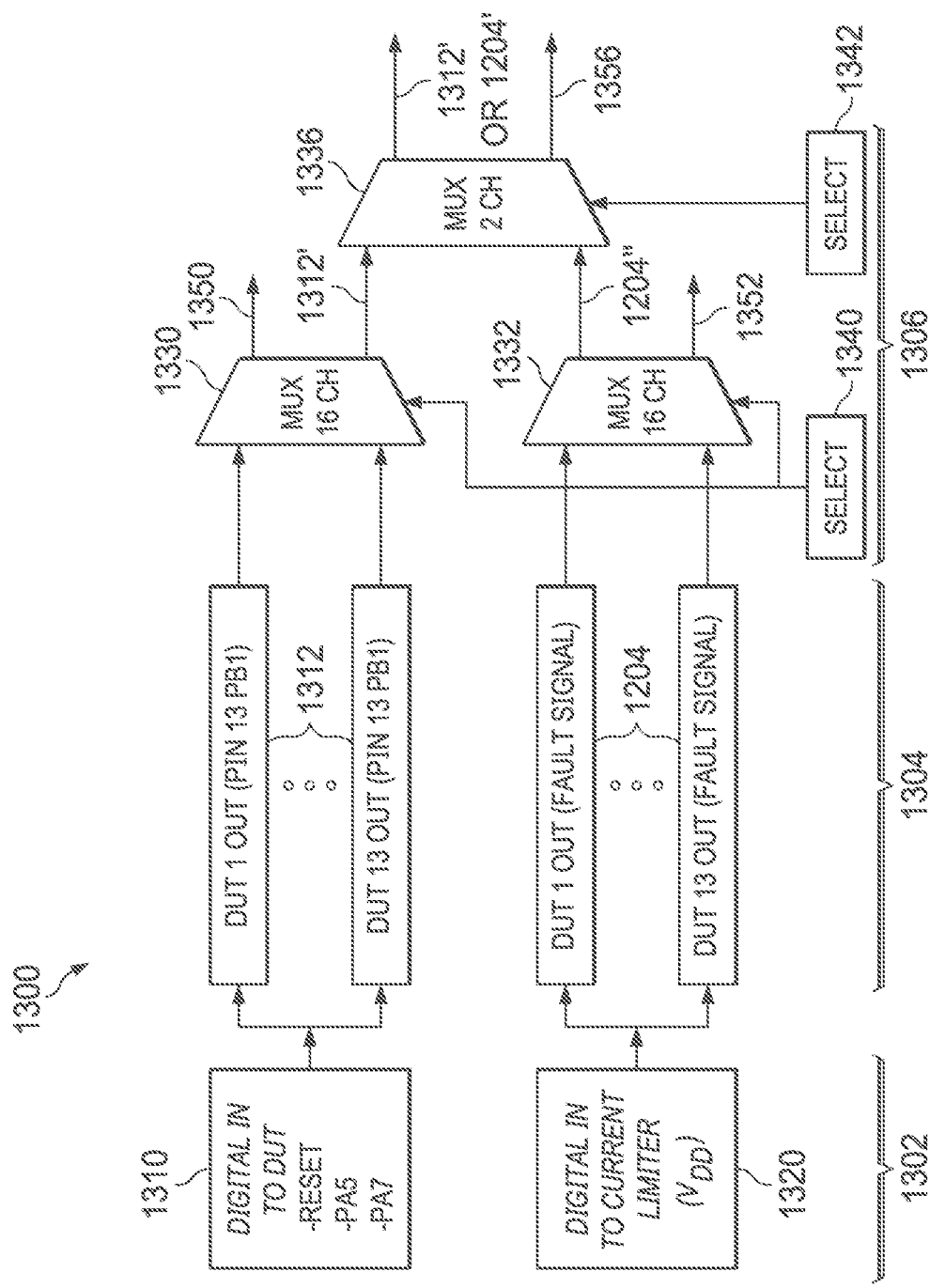
FIG. 13 shows an example stimulation and monitoring system for providing electrical stimulation and monitoring of individual devices under test (DUTs), according to one example embodiment.
Figure 14:
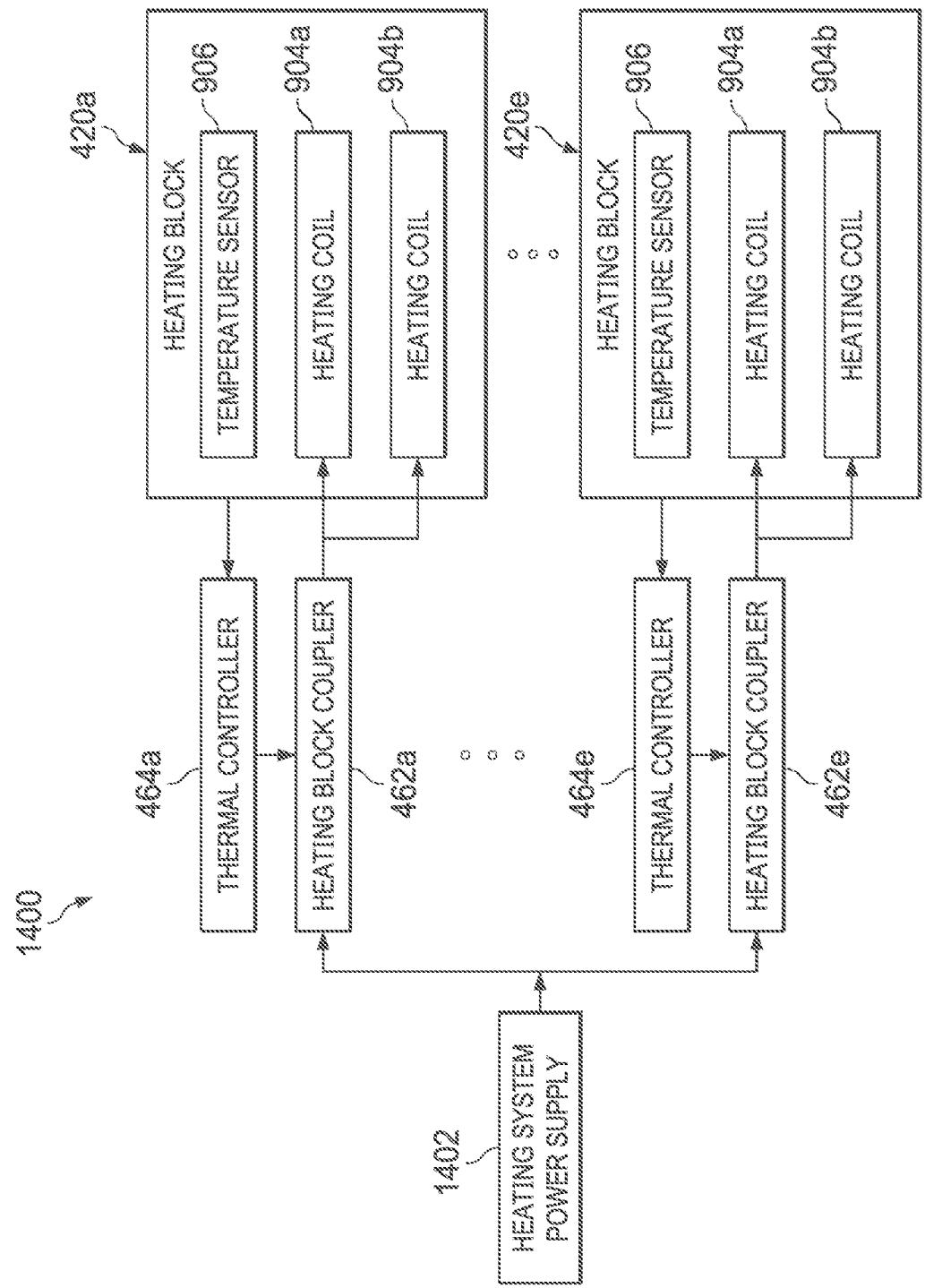
FIG. 14 shows a temperature control system for controlling heating elements provided in a strip socket, according to one example embodiment.

FIGS. 12-14 illustrate example systems for burn-in testing of individual DUTs 302 on device strip 300a using tester driver 1010 and circuitry on burn-in board 400, including burn-in test circuitry 470 and heating control circuitry 460.

FIG. 12 shows an example power supply system 1200 arranged to provide power for the example device strip 300a mounted in heated strip socket 402 on the example burn-in board 400, according to one example embodiment. The various components and functionality of power supply system 1200 may be embodied by any suitable electronics on burn-in board 400 (e.g., burn-in test circuitry 470) and/or tester driver 1010. As shown, the illustrated power supply system 1200 includes (a) five fault-detection drivers 1202a-1202e, each including a power supply providing power to the DTUs in a corresponding device panel 306a-306e, for detecting an electrical fault (e.g., short) at each individual DUT 302 in the respective device panel 306a-306e, and (b) one digital signal analysis driver 1206 providing both power and digital stimulus signaling to device panels 306a-306e for monitoring the performance of individual DUTs 302 of device panels 306a-306e. In one example embodiment, each fault-detection driver 1202a-1202e may provide a supply voltage VDD of +5.5V, at 10A (providing approximately 40 mA per individual DUT), with a total power of 60 W.

As discussed above, each device panel 306a-306e includes 234 DUTs arranged in 18 columns, or "clusters," each including 13 DUTs (in this discussion "DUTs" refers to devices 302 on device strip 300a). As shown in FIG. 12, each cluster is associated with 13 current limiters 474, each connected to an individual DUT. For each device panel 302a-302e, each respective current limiter 474 detects the voltage and/or current at its corresponding DUT and outputs a fault detect signal 1204 indicate the presence (or lack) of an electrical fault, e.g., a short circuit, with the corresponding DUT. The fault detect signals 1204 from the 234 current limiters 474 associated with each of the respective device panels 302a-302e may be multiplexed and monitored to detect electrical faults (e.g., shorts) at individual DUTs, as discussed below.

FIG. 13 shows an example stimulation and monitoring system 1300 for providing electrical stimulation and monitoring of the 13 DUTs in one selected device cluster in a selected device panel 302a, according to one example embodiment. The various components and functionality of stimulation and monitoring system 1300 may be embodied by any suitable electronics on burn-in board 400 (e.g., burn-in test circuitry 470) and/or tester driver 1010.

System 1300 includes input test signals 1302 applied to the 13 DUTs in the selected device cluster, output test signals 1304 resulting from the input test signals 1302, and a multiplexer system 1306 for selectively receiving the output test signals 1304 from the 13 DUTs. As shown, two types of input test signals are applied to each of the 13 DUTs in the selected device cluster: (1) performance monitoring input signals 1310 applied to selected pins on each DUT to trigger defined performance monitoring output signals 1312 from each DUT, and (2) input power signals 1320 (VDD) applied to each DUT, wherein the current limiter 474 connected to each respective DUT may detect whether an overcurrent fault is present and output fault detect signals 1204 discussed above with respect to FIG. 12.

Performance monitoring input signals 1310 may be applied to any number of type(s) of pins on each DUT. For example, performance monitoring input signals 1310 may include pin-specific signals applied to each of multiple pins on each respective DUT, each configured to generate a corresponding pin-specific output signal 1312. Each pin-specific output signal 1312 output by each DUT may be transmitted over a separate line between the DUT and performance signal multiplexer 1330, discussed below. For example, performance monitoring input signals 1310 for each DUT may include a first pin-specific signal applied to a RESET pin for triggering a first defined output signal 1312, and three additional pin-specific signals applied to three additional pins on the DUT configured to generate three additional output signals 1312, wherein the four output signals 1312 generated by the DUT are output over four lines connected to the performance signal multiplexer 1330.

The output performance monitoring output signals 1312 output by each DUT and the fault detect signals 1204 output by current limiters 474 are passed to the multiplexer system 1306 for selective monitoring of each individual DUT. The multiplexer system 1306 includes the performance signal multiplexer 1330 discussed above, a power signal multiplexer 1332, and a multi-signal-type multiplexer 1336. Multiplexer system 1306, including multiplexers 1330, 1332, and 1336, may be provided on burn-in board 400. For example, multiplexer system 1306 may correspond with multiplexer system 472 shown in FIG. 4B.

As discussed above, the performance signal multiplexer 1330 receives performance monitoring output signals 1312 from each of the 13 DUTs, via multiple lines connected between each DUT and performance signal multiplexer 1330, corresponding with the multiple pin-specific output signals output by each DUT). Performance signal multiplexer 1330 may be a 16-channel multiplexer configured to manage the output signals from the 13 DUTs.

The power signal multiplexer 1332 receives a fault detect signal 1204 from each of the 13 DUTs. Power signal multiplexer 1332 may be a 16-channel multiplexer configured to manage the 13 fault detect signals 1204.

The performance signal multiplexer 1330 and power signal multiplexer 1332 may be controlled by multiplexer control circuitry 1340, to select both types of output signals, i.e., performance monitoring output signals 1312 and fault detect signals 1204, for a selected DUT. The selected signals for the selected DUT, indicated as signals 1312' and 1204', are passed to the multi-signal-type multiplexer 1336.

Multi-signal-type multiplexer control circuitry 1342 connected to the multi-signal-type multiplexer 1336 may select between the two types of output signals for the selected DUT (performance monitoring output signals 1312' and fault detect signals 1204'), and pass the selected one of signals 1312' or 1204' to suitable signal analysis circuitry, e.g., to (a) identify an electrical fault (e.g., short) associated with the selected DUT (based on signals 1204') and (b) analyze the performance of the selected DUT (based on signals 1312'). In addition, system 1300 may include circuitry configured to analyze the performance of each multiplexer 1330, 1332, and 1336, by monitoring the selected signals 1350, 1352, and 1356 passed by multiplexers 1330, 1332, and 1336, to thereby provide a verification check of the selected DUT signals 1312' or 1204'.

FIG. 13 shows a temperature control system 1300 for controlling heating blocks 420a-420e, according to one example embodiment. The various components and functionality of temperature control system 1300 may be embodied by any suitable electronics on burn-in board 400 (e.g., heating control circuitry 460) and/or tester driver 1010. Temperature control system 1300 may be configured to provide independent control of each heating block 420a-420e, and in some embodiments, independent control of individual heating elements (e.g., heating coils) 904 within each heating block 420a-420e, which may provide various advantages. For example, by providing independent control of heating blocks 420a-420e and/or heating elements 904, different temperatures may be applied to different device panels 302a-302e and/or different groups of DUTs within an individual device panel 302a-302e, to thereby generate a profile of DUT performance vs. temperature during a single burn-in test, which may be used to determine a particular temperature or temperatures at which the DUTs begin to fail. As another example, independent control of heating blocks 420a-420e and/or heating elements 904 provides the ability to perform a burn-in test on only a selected portion of a device strip.

As shown in FIG. 14, temperature control system 1400 may include heating blocks 420a-420e, each including a temperature sensor 906 and two heating coils 904; thermal controllers 464a-464e connected to heating block couplers 462a-462e each configured to control a respective heating block 420a-420e; and a heating system power supply 1402. The heating system power supply 1402 may be configured to supply power to heating coils 904 in each heating block 420a-420e. Each thermal controller 464a-464e may be configured to control power applied to each heating coil 904 within its corresponding heating block 420a-420e via the respective heating block coupler 462a-462e, based on temperature measurements from the respective temperate sensor 906 and one or more defined setpoint or threshold temperatures controlled by the respective thermal controller 464a-464e.

Although the disclosed embodiments are described in detail in the present disclosure, it should be understood that various changes, substitutions and alterations can be made to the embodiments without departing from their spirit and scope.

The invention claimed is:

1. A burn-in board for burn-in testing of devices, the device comprising:
   a printed circuit board (PCB);
   a strip socket mounted to the PCB, the strip socket including:
      a socket base configured to receive a device strip including an array of devices mounted on a device strip substrate;
      a socket lid;
      at least one heating block associated with the socket lid;
      wherein the socket lid is movable between (a) an open position allowing the device strip to be mounted on the socket base and (b) a closed position in which the mounted device strip is arranged between the socket lid and socket base; and
      an array of conductive contacts, each configured to contact a respective device in the array of devices,
   heating control circuitry configured to control the at least one heating block to provide heat to the device strip; and
   burn-in test circuitry connected to the conductive contacts for communicating input test signals to individual devices of the array of devices on the device strip and output test signals from the individual devices.

2. The burn-in board of claim 1, wherein the at least one heating block is integrated in, or mounted to, the socket lid.

3. The burn-in board of claim 1, wherein:
   the socket base includes a contactor plate configured to support the device strip, the contactor plate including an array of device contact holes; and
   in the closed position of the socket lid, the conductive contacts project through the array of device contact holes in the contactor plate and into contact with individual devices on the device strip.

4. The burn-in board of claim 1, wherein:
   the device strip includes multiple device panels, each device panel including multiple devices;
   the strip socket includes multiple sections, each corresponding with a respective device panel on the device strip; and
   the at least one heating block comprises multiple heating blocks, each arranged for heating a respective device panel on the device strip.

5. The burn-in board of claim 4, wherein the multiple heating blocks are independently controllable to provide independent temperature control of each of the multiple device panels on the device strip.

6. The burn-in board of claim 1, further comprising:
   a multiplexer connected to a plurality of conductive contacts in the array of conductive contacts, the plurality of conductive contacts configured to contact a corresponding plurality of devices in the array of devices;
   a multiplexer control circuitry configured to control the multiplexer to selectively receive signals from each device in the plurality of devices via a respective conductive contact of the plurality of conductive contacts.

7. The burn-in board of claim 1, comprising a multiplexer system including:

a performance signal multiplexer connected to a first subset of conductive contacts in the array of conductive contacts;
a power signal multiplexer connected to a second subset of conductive contacts in the array of conductive contacts; and
multi-signal-type multiplexer control circuitry configured to control the performance signal multiplexer and the power signal multiplexer to selectively monitor device performance signals and power signals from individual devices in the array of devices.

8. A strip socket for burn-in testing of an array of devices provided on a device strip, wherein the strip socket comprises:
a socket base configured to receive the device strip including the array of devices, the socket base including a contactor plate configured to support the device strip, the contactor plate including an array of contact holes;
an array of conductive contacts;
a socket lid;
at least one heating block associated with the socket lid;
wherein the socket lid is movable between (a) an open position allowing the device strip to be mounted on the socket base and (b) a closed position in which the mounted device strip is arranged between the socket lid and socket base; and
wherein in the closed position of the socket lid, respective conductive contacts in the array of conductive contacts project through respective contact holes in the array of contact holes in the contactor plate to come into contact with respective devices in the array of devices on the device strip.

9. The burn-in board of claim 8, wherein the at least one heating block is integrated in, or mounted to, the socket lid.

10. The burn-in board of claim 8, wherein in the closed position of the socket lid, the mounted device strip is physically compressed between the socket lid and the socket base to bring the conductive contacts into contact with respective devices in the array of devices on the device strip.

11. The burn-in board of claim 8, wherein:
the device strip includes multiple device panels, each including multiple devices;
the strip socket includes multiple sections, each corresponding with a respective device panel on the device strip; and
the at least one heating block comprises multiple heating blocks, each arranged for heating a respective device panel on the device strip.

12. The burn-in board of claim 11, wherein the multiple heating blocks are independently controllable to provide independent temperature control of each of the multiple device panels on the device strip.

13. A system for burn-in testing of devices
a burn-in test machine; and
a burn-in board comprising:
a printed circuit board (PCB);
a strip socket mounted to the PCB, the strip socket including:
a socket base configured to receive a device strip including an array of devices mounted on a device strip substrate;
a socket lid;
at least one heating block associated with the socket lid;
wherein the socket lid is movable between (a) an open position allowing the device strip to be mounted on the socket base and (b) a closed position in which the mounted device strip is arranged between the socket lid and socket base;
an array of conductive contacts, each configured to contact a respective device in the array of devices; and
a connection interface connected to the array of conductive contacts;
heating control circuitry configured to control the at least one heating block to provide heat to the device strip; and
wherein the burn-in test machine is configured to:
supply input test signals to individual devices on the device strip via the connection interface and the conductive contacts of the strip socket; and
receive output test signals from the individual devices via the conductive contacts and connection interface of the strip socket.

14. The system of claim 13, wherein the burn-in test machine comprises a test bench.

15. The system of claim 13, wherein the burn-in test machine comprises a burn-in oven machine.

16. The system of claim 13, wherein the at least one heating block is integrated in, or mounted to, the socket lid.

17. The system of claim 13, wherein in the closed position of the socket lid, the mounted device strip is physically compressed between the socket lid and the socket base to bring the conductive contacts into contact with the individual devices on the device strip.

18. The system of claim 13, wherein:
the device strip includes multiple device panels, each including multiple devices;
the strip socket includes multiple sections, each corresponding with a respective device panel on the device strip; and
the at least one heating block comprises multiple heating blocks, each arranged for heating a respective device panel on the device strip;
wherein the multiple heating blocks are independently controllable to provide independent temperature control of each of the multiple device panels on the device strip.

19. The system of claim 13, wherein the burn-in test electronics include:
electrical fault detection circuitry configured to detect an electrical fault associated with each individual device; and
device performance monitoring circuitry configured to measure an operational performance of each individual device.

20. A strip socket for burn-in testing of an array of devices provided on a device strip including multiple device panels, wherein respective device panels include respective devices in the array of devices, wherein the strip socket comprises:
a socket base configured to receive the device strip including the array of devices;
a socket lid;
multiple heating blocks associated with the socket lid, wherein respective ones of the multiple heating blocks are arranged for heating respective ones of the multiple device panels on the device strip;
wherein the socket lid is movable between (a) an open position allowing the device strip to be mounted on the socket base and (b) a closed position in which the mounted device strip is arranged between the socket lid and socket base; and an array of conductive contacts arranged to contact respective devices in the array of devices.

21. The burn-in board of claim 20, wherein the multiple heating blocks are independently controllable to provide independent temperature control of the respective device panels of the multiple device panels.

\* \* \* \* \*